United States Patent
Mayer et al.

(10) Patent No.: US 6,890,416 B1
(45) Date of Patent: May 10, 2005

(54) COPPER ELECTROPLATING METHOD AND APPARATUS

(75) Inventors: Steven T. Mayer, Lake Oswego, OR (US); Evan E. Patton, Portland, OR (US); Robert L. Jackson, San Jose, CA (US); Jonathan D. Reid, Sherwood, OR (US)

(73) Assignee: Novellus Systems, Inc., San Jose, CA (US)

( * ) Notice: Subject to any disclaimer, the term of this patent is extended or adjusted under 35 U.S.C. 154(b) by 230 days.

(21) Appl. No.: 10/318,497

(22) Filed: Dec. 11, 2002

Related U.S. Application Data

(62) Division of application No. 09/706,272, filed on Nov. 3, 2000, now Pat. No. 6,527,920.
(60) Provisional application No. 60/203,432, filed on May 10, 2000.

(51) Int. Cl.[7] ............................. C25D 3/00; C25D 3/38
(52) U.S. Cl. ...................... 205/261; 205/291; 205/296
(58) Field of Search ................................ 204/252, 263, 204/237; 205/291, 640, 80, 296, 672, 261

(56) References Cited

U.S. PATENT DOCUMENTS

| | | | |
|---|---|---|---|
| 3,450,625 A | * | 6/1969 | Ramsey et al. ............. 204/237 |
| 3,652,442 A | | 3/1972 | Powers et al. |
| 3,706,651 A | | 12/1972 | Leland |
| 3,862,891 A | | 1/1975 | Smith |
| 4,033,833 A | | 7/1977 | Bestel et al. |
| 4,073,708 A | * | 2/1978 | Hicks ......................... 205/574 |
| 4,082,638 A | | 4/1978 | Jumer |
| 4,240,886 A | | 12/1980 | Hodges et al. |
| 4,272,335 A | | 6/1981 | Combs |
| 4,304,641 A | | 12/1981 | Grandia et al. |
| 4,469,564 A | | 9/1984 | Okinaka et al. |
| 4,545,877 A | | 10/1985 | Hillis |
| 4,604,177 A | | 8/1986 | Sivilotti |
| 4,604,178 A | | 8/1986 | Fiegener et al. |
| 4,605,482 A | | 8/1986 | Shiragami et al. |
| 4,696,729 A | | 9/1987 | Santini |
| 4,828,654 A | | 5/1989 | Reed |
| 4,906,346 A | | 3/1990 | Hadersbeck et al. |
| 4,931,149 A | | 6/1990 | Stierman et al. |
| 4,933,061 A | | 6/1990 | Kulkarni et al. |
| 5,039,381 A | | 8/1991 | Mullarkey |
| 5,096,550 A | | 3/1992 | Mayer et al. |
| 5,146,136 A | | 9/1992 | Ogura et al. |

(Continued)

FOREIGN PATENT DOCUMENTS

| | | |
|---|---|---|
| EP | 0037325 | 3/1981 |
| JP | 59-162298 | 9/1984 |
| JP | 09-53197 | 2/1997 |
| JP | 2001316887 | 11/2001 |
| WO | WO99/41434 | 8/1999 |

OTHER PUBLICATIONS

Fang, et al., "Uniform Copper Electroplating on Resistive Substrates," Abs. 167, 205th Meeting, © 2004 The Electrochemical Society, Inc., 1 page.

Primary Examiner—Donald R. Valentine
(74) Attorney, Agent, or Firm—Beyer Weaver & Thomas, LLP

(57) ABSTRACT

An electroplating apparatus prevents anode-mediated degradation of electrolyte additives by creating a mechanism for maintaining separate anolyte and catholyte and preventing mixing thereof within a plating chamber. The separation is accomplished by interposing a porous chemical transport barrier between the anode and cathode. The transport barrier limits the chemical transport (via diffusion and/or convection) of all species but allows migration of ionic species (and hence passage of current) during application of sufficiently large electric fields within electrolyte.

31 Claims, 10 Drawing Sheets

U.S. PATENT DOCUMENTS

| | | |
|---|---|---|
| 5,156,730 A | 10/1992 | Bhatt et al. |
| 5,162,079 A | 11/1992 | Brown |
| 5,217,586 A | 6/1993 | Datta et al. |
| 5,316,642 A | 5/1994 | Young, Jr. et al. |
| 5,368,711 A | 11/1994 | Poris |
| 5,391,285 A | 2/1995 | Lytle et al. |
| 5,421,987 A | 6/1995 | Tzanavaras et al. |
| 5,443,707 A | 8/1995 | Mori |
| 5,472,592 A | 12/1995 | Lowery |
| 5,476,578 A | 12/1995 | Forand |
| 5,498,325 A | 3/1996 | Nishimura et al. |
| 5,516,412 A | 5/1996 | Andricacos et al. |
| 5,567,300 A | 10/1996 | Datta et al. |
| 5,935,402 A | 8/1999 | Fanti |
| 6,027,631 A | 2/2000 | Broadbent |
| 6,126,798 A | 10/2000 | Reid et al. |
| 6,132,587 A | 10/2000 | Jorne et al. |
| 6,193,860 B1 | 2/2001 | Weling |
| 6,251,255 B1 | 6/2001 | Copping et al. |
| 6,368,475 B1 | 4/2002 | Hanson et al. |
| 6,391,166 B1 | 5/2002 | Wang |
| 6,391,188 B1 | 5/2002 | Goosey |
| 6,395,152 B1 | 5/2002 | Wang |
| 6,402,923 B1 | 6/2002 | Mayer et al. |
| 6,497,801 B1 | 12/2002 | Woodruff et al. |
| 6,527,920 B1 * | 3/2003 | Mayer et al. ............... 204/237 |
| 6,755,954 B2 | 6/2004 | Mayer |
| 6,773,571 B1 | 8/2004 | Mayer et al. |
| 2003/0029527 A1 | 2/2003 | Yajima et al. |
| 2003/0102210 A1 | 6/2003 | Woodruff |

* cited by examiner

COPPER ELECTROPLATING METHOD AND APPARATUS

CROSS-REFERENCE TO RELATED APPLICATION

This is a divisional application Ser. No. 09/706,272 filed Nov. 03, 2000 now U.S. Pat. No. 6,527,920, claims priority under 35 USC 119(e) from U.S. Provisional Application No. 60/203,432, having Steven T. Mayer et al. as inventors, filed May 10, 2000, and titled "METHODS, MATERIALS, AND APPARATUS FOR IMPROVED COPPER ELECTROPLATING. Provisional Application No. 60/203,432 is incorporated herein by reference for all purposes.

BACKGROUND OF THE INVENTION

This invention relates to electroplating metal layers onto substrates and electropolishing metal layers on substrates. More specifically, it relates to apparatus for controlling the composition, flow, and potential distribution of electrolyte while electroplating or electropolishing a silicon wafer.

Damascene processing is a method for forming metal lines on integrated circuits. It is a significant departure from traditional methods that require blanket deposition and subsequent patterning of aluminum. In comparison to such traditional processes, Damascene processing requires fewer processing steps and offers a higher yield. In Damascene processes, copper is a favored over aluminum because of its higher conductivity and resistance to electro migration.

In a typical Damascene process, copper is deposited in at least two steps. First, the process deposits a very thin layer of the metal by physical vapor deposition (PVD). Then, the process forms a thicker copper electrofill layer by electroplating. The PVD process is typically sputtering. One example of a commercially successful apparatus that electroplates copper onto wafer active surface is the SABRE™ electroplating apparatus available from Novellus Systems, Inc. of San Jose, Calif. and described in U.S. patent application Ser. No. 08/969,984, "CLAMSHELL APPARATUS FOR ELECTROCHEMICALLY TREATING SEMICONDUCTOR WAFERS" naming E. Patton et al. as inventors, and U.S. application Ser. No. 08/970,120, both filed Nov. 13, 1997, which are herein incorporated by reference in their entirety and for all purposes.

Electroplated copper should fill Damascene trenches from the "bottom-up." If instead the copper plates on the top and side-walls of the Damascene trenches, voids form in the conductive lines, reducing conductivity and causing the integrated circuit to be unusable. The plating electrolyte (often referred to as the "plating bath") composition helps control the conformation of electroplated copper. Certain organic additives known as "accelerators" or "brighteners" significantly improve the copper feature filling when added to the electrolyte. In fact, a significant technical challenge in plating copper on integrated circuits involves maintaining stable additives in the electrolyte. If the additives degrade with use, one cannot achieve consistent bottom-up plating. A discussion of bath degradation and maintenance strategies can be found in "Use of On-Line Chemical Analysis for Copper Electrodeposition," R. J. Contolini, J. D. Reid, S. T. Mayer, E. K. Broadbent, and R. L. Jackson, Advanced Metallization Conference, 1999, Sep. 28–30, 1999, Orlando, Fla., Paper # 27. In general, a controlled composition of a plating bath is essential to maintain good bottom-up electroplating, uniformity and other desirable plating characteristics. While certain organic additives promote bottom-up plating, other compounds interfere with such plating.

Some of the interfering compounds are decomposition products of the desirable accelerators. It has been found, for example, that poor plating is often associated with decomposition of accelerators. Many plating baths contain accelerators such as dimercaptopropane sulfonic acid (SPS) or N-dimethyldithiocarbamic acid (DPS). These can breakdown to their monomers (e.g., mercaptopropane sulfonic acid (MPS)). Small amounts of MPS in an SPS or DPS bath can substantially degrade bottom-up filling.

Additive degradation may be mitigated by periodically dumping an old bath and adding a fresh bath (sometimes termed a "bleed and feed" or a "bath replenishment" procedure). U.S. Pat. No. 5,352,350 issued to Andricos et. al. describes an embodiment of this approach. In theory, this approach maintains the concentration of "poisons" (e.g., MPS or other breakdown product) at an acceptable steady state value. Unfortunately, it produces a substantial volume of waste and requires a continuous detailed bath analysis using maintenance metrology. Waste generation is environmentally problematic and requires costly treatment. Further, as wafer diameters increase (as they will continue to do), the amount of required dumping increases.

In another approach, the plating apparatus may include an adsorption column (e.g., an activated carbon fluidized bed) to remove poisons. Generally, such beds lack the specificity to remove only the unwanted poisons. Thus, this approach typically strips all additives from the plating bath to create a "virgin" solution. This solution is then reintroduced to the main bath together with appropriate levels of fresh additive, Unfortunately, this approach is often uneconomical because it requires (i) processing of large volumes of plating bath, (ii) large quantities of fresh accelerators and other expensive additives, and (iii) a large carbon filter, which need to be replaced frequently.

Most organic additive breakdown processes occur at the anode surface. To reduce breakdown, plating systems may employ copper anodes containing 0.02 to 0.04% phosphorus. Such anodes form a surface film with better tenacity and less particle generation than non-phosphourus containing anodes and also act as a protective diffusion barrier for brighteners (see Modern Electroplating, Frederick A. Lowenheim, editor, Third edition, pg 192). Still, the film has a particulate morphology and accumulates breakdown products. Also, it has been found that the bath plating quality (as evidenced by copper layer conformation and defects) is strongly sensitive to disturbances in the anode film caused by stirring and other mechanical perturbations commonly employed in modern electroplating apparatus.

There are generally two classes of anodes that are used in metal plating: consumable (also referred to as active) anodes, and non-consumable (also referred to as "dimensionally stable" and non-reactive) anodes. The reactions of the active anode for plating copper are simple and balanced (no overall depletion or generation of new species). Copper ion in the solution are reduced at the cathode and removed from the electrolyte, simultaneously as copper is oxidized at the anode and copper ions added to the electrolyte. In contrast, the reactions in a non-consumable system are unbalanced. The two reactions are:

$$H_2O \rightarrow \tfrac{1}{2}O_2 2H^+ + 2e^- \quad \text{(anode)}$$

$$Cu^{+2} + 2e^- \rightarrow Cu \quad \text{(cathode)}.$$

U.S. Pat. No. 4,469,564 issued to Okinaka et al. describes a copper electroplating system in which the non-consumable anode is surrounded by a cation exchange membrane. The membrane prevents passage of organic additives and anions, and thereby prevents the organic additives from contacting the non-consumable anode, while allowing passage of positive ions (generally hydrogen) to pass cationic current. When the membrane is present, the anode chamber will accumulate hydrogen ion. Accordingly, "the feature is especially advantageous for copper electroplating processes using non-consumable electrodes because of the high consumption of additives and that the copper can be added to the cathode side of the membrane so that acid copper ions need not pass through the membrane." Unfortunately, the resistance to ion mass transport across such membranes is great.

U.S. Pat. No. 5,162,079 issued to Brown describes an electroplating system in which the non-consumable anode is enclosed in a compartment having a nonporous anion or cation exchange membrane with a means of flushing the anode compartment to maintain the acid concentration there.

What is needed therefore is improved electroplating technology that reduces the rate at which additives break down, minimizes power consumption, improves the bath stability/longevity, and minimizes chemical waste generation.

SUMMARY OF THE INVENTION

The present invention overcomes the above difficulties caused by anode mediated degradation of electrolyte additives by separating the electrolyte into a portion associated with the anode and a portion associated with the cathode (anolyte and catholyte, respectively). The separation is preferably accomplished by interposing a microporous chemical transport barrier (sometimes referred to as a diffusion barrier) between the anode and cathode. The transport barrier should limit the chemical transport (via diffusion and/or convection) of most species but allow migration of anion and cation species (and hence passage of current) during application of electric fields associated with electroplating. In other words, the transport barrier should limit the free cross-mixing of anolyte and catholyte.

A general advantage of separate anolyte and catholyte chambers is the ability to separately use materials having vastly different physical and chemical properties in the two chambers. Examples of such properties include viscosity, metal ion concentration, water concentration, conductivity, and, importantly, organic additive concentration. Some conditions are better suited for the anode and others for the cathode. Generally, in electroplating baths, any poison forming organic additive should be kept out of the anode chamber.

The designs of this invention have additional benefits. Particles that are often generated at the copper anode are prevented from passing into the cathode (wafer) chamber area and thereby causing a defect in the part. In a conventional design, the anode and cathode are exposed to the same electrolyte. Initially the anode contains no protective film and therefore the rate of additive consumption is high. It is often required therefore to condition the anode and plating bath by passing a substantial amount of current through the cell prior to plating product wafers to establish an equilibrium condition. Several bleed-and-feed bath additions may also be required to reach a steady state condition. In the design of this invention, such start up processing is not necessary. Furthermore, in most conventional designs, when plating is not performed in a cell, the anode is still immersed in the bath electrolyte. Under these conditions, the anode protective film slowly degrades. (It is believed to slowly dissolve or be oxidized by dissolved oxygen from air in the electrolyte.) The consumption of plating bath additive can be dependent on a number of anode related conditions such as 1) the charge passed through the cell 2) the time since cell use, 3) the flow in the anode compartment, and other physical changes. In the design of this invention, these dependencies are removed. One aspect of this invention provides an apparatus for electroplating copper onto a substrate. The apparatus may be characterized by the following features: (a) a cathode electrical connection that can connect to the substrate and apply a potential allowing the substrate to become a cathode; (b) an anode electrical connection that can connect to an anode and apply an anodic potential to the anode; and (c) a porous transport barrier defining an anode chamber and a cathode chamber. The porous transport barrier enables migration of ionic species, including copper ions, across the transport barrier while substantially blocking diffusion or mixing (i.e. transport across the barrier) of solvent or solutes between the anolyte and catholyte, thereby preventing non-ionic organic bath additives from crossing the transport barrier. The ionic species are driven across the barrier by migration (movement in response to the imposed electric field) but the neutral species do not transverse the transport barrier. Generally, the anode chamber contains an anolyte and the cathode chamber contains a catholyte. The transport barrier maintains different chemical compositions for the anolyte and the catholyte.

In one embodiment, the anolyte includes one or more copper salts (e.g., copper sulfate) dissolved in water. It is substantially devoid of organic species, particularly accelerators. The electrolyte also can contain an acid. Typical formulations for the anolyte have between about 10 and 50 gm/l copper (as $Cu^{+2}$), and between about 0 and 200 gm/l $H_2SO_4$. More preferably, the anolyte concentration of copper is between about 15 and 40 gm/l and the concentration of acid is between about 0 and 180 gm/l $H_2SO_4$. Examples of two preferred formulations of electrolyte are (1) about 40 gm/l $Cu^{+2}$ and at most about 10 g/L $H_2SO_4$ (referred to as a low acid formulation) and (2) about 18 g/L $Cu^{+2}$ and about 180 g/L $H_2SO_4$ (referred to as a high acid formulation). Generally, the catholyte contains a substantially greater concentration of the non-ionic organic plating additives than the anolyte.

In one preferred embodiment, the apparatus includes an anolyte storage reservoir or source connected to the anode chamber to provide anolyte to the anode chamber. The apparatus in this embodiment may also include a conduit between the anode reservoir/source and the cathode chamber allowing periodic delivery of electrolyte from the anode reservoir to the cathode chamber. The apparatus may also include a catholyte storage reservoir connected to the cathode chamber to provide catholyte to the cathode chamber.

In one embodiment, the apparatus further includes a conduit allowing removal of electrolyte from the cathode chamber. This electrolyte may be provided to an electrolyte treatment system that treats the electrolyte for reintroduction to the electroplating apparatus. Preferably, the electrolyte treatment system includes an activated carbon absorbing medium. The treated electrolyte may have its additives substantially removed so that it can be introduced into the anode chamber.

Various materials may be used in the transport barrier. Examples include porous glasses, porous ceramics, silica aerogels, organic aerogels, porous polymeric materials, and filter membranes. In a preferred embodiment, the transport barrier is made from a sintered polyethylene or a sintered polypropylene. In a specific embodiment, the apparatus includes a carbon filter layer that is substantially coextensive with the transport barrier. The carbon filter layer can filter non-ionic organic bath additives from a catholyte that manage to pass through the transport barrier toward the anode chamber. In an especially preferred embodiment, the transport barrier comprises a three-layer membrane including a first layer of porous material sandwiched between two additional layers of porous material. In this embodiment, the first layer is substantially thinner than the two additional layers.

In some embodiments, the anode chamber and the transport barrier are designed or configured to allow a limited flow of anolyte from the anode chamber into the cathode reservoir or chamber. This is permitted while substantially preventing catholyte from flowing from the cathode chamber into the anode chamber. Such systems may allow concentrated anolyte to exit directly to the cathode chamber and thereby maintain desired concentrations anolyte and catholyte with minimal external apparatus. The flow of anolyte to cathode chamber also allows "flushing" of any inadvertent or otherwise unpreventable transport of additive that are transported to the anolyte chamber.

Another aspect of the invention provides a method of electroplating copper onto a substrate in a manner reducing the likelihood of generating electrolyte species that inhibit bottom-up plating on the substrate. The method may be characterized by the following sequence: (a) providing anolyte in an anode chamber having an anode and being separated from a cathode chamber by a transport barrier as described above; (b) providing catholyte to the cathode chamber containing the substrate; and (c) applying a potential difference between the substrate and the anode to allow the substrate to become a cathode and plate copper metal onto the substrate without allowing the concentration of plating additives in the anolyte to substantially increase. Other features of the method may include (i) providing anolyte to the anode chamber from an anolyte storage reservoir and/or (ii) transferring anolyte to the cathode chamber.

In many embodiments, the method will also require removing catholyte from the cathode chamber and routing the removed catholyte to a catholyte reservoir (which may be a central plating bath for multiple plating cells, for example). The catholyte from a catholyte storage reservoir may be cycled back to the cathode chamber to maintain good convection.

In some embodiments, catholyte will be treated to convert it to anolyte. Such method may be characterized as follows: (a) removing catholyte from the cathode chamber; (b) treating the catholyte to reduce the concentration of organic additives in the catholyte to produce an anolyte that is substantially free of additives; and (c) introducing the treated anolyte produced at (b) to the anode chamber. In a preferred embodiment, the catholyte is treated by passing it through an activated carbon absorbing medium or a reverse osmosis separation apparatus, or a combination of these.

Note that separate anode and cathode chambers of this invention can also be used in electropolishing, which has its own set of separate requirements for the anolyte and catholyte. Thus, another embodiment of this invention provides an apparatus for electropolishing copper on a substrate. As in the electroplating embodiment, the apparatus includes a transport barrier defining an anode chamber and a cathode chamber. In a preferred example, the transport barrier maintains the viscosity of the catholyte at a substantially lower value than the viscosity of the anolyte.

Another aspect of the invention provides copper electroplating apparatus that may be characterized by the following features: (a) separate anode and cathode chambers ionically connected to one another; (b) an anolyte flow loop that circulates anolyte into, out of, and through the anode chamber; and (c) a catholyte flow loop that circulates catholyte into, out of, and through the cathode chamber. The apparatus substantially prevents anolyte and catholyte from mixing and thereby maintains different compositions of anolyte and catholyte. Preferably, the separate anode and cathode chambers are maintained separate by a transport barrier as described above. This prevents free mixing of the anolyte and catholyte and thereby allows the compositions of anolyte and catholyte to remain different in their respective flow loops.

A somewhat different aspect of the invention pertains to another method of electroplating copper onto a substrate, in a manner reducing the likelihood of generating electrolyte species that inhibit bottom-up plating on the substrate. This method may be characterized by the following sequence: (a) cycling anolyte through an anolyte flow loop including an anode chamber having an anode; (b) cycling catholyte through a catholyte flow loop including a cathode chamber having a cathode onto which copper is electroplated, wherein the anode chamber and cathode chamber are separate but ionically connected chambers; and (c) passing current through the cathode, catholyte, anolyte, and anode to allow electroplating of copper onto the cathode. Preferably, (a), (b), and (c) are performed concurrently. Various aspects of this method may be performed and implemented as described above.

These and other features and advantages of the present invention will be described below with reference to the associated drawings.

DESCRIPTION OF THE PREFERRED EMBODIMENTS

Introduction

This invention employs anode and cathode chambers that effectively maintain separate chemical and/or physical environments proximate the anode and cathode. They do this while allowing migration of ionic species between the chambers. In a preferred embodiment, the anode and cathode are separated by a porous membrane that acts a chemical transport barrier. In this embodiment, the membrane prevents transport of non-ionic species such as organic bath additives. In a specific embodiment for use with copper electroplating, the anolyte in the anode chamber is substantially free of organic additives. It contains an aqueous solution of the metal salt such as copper sulfate or copper pyrophosphate, and is substantially devoid of organic additives. In preferred embodiments, the anode is composed of copper or copper with small amounts of additive phosphorous (e.g., <1%).

Figure 1A:
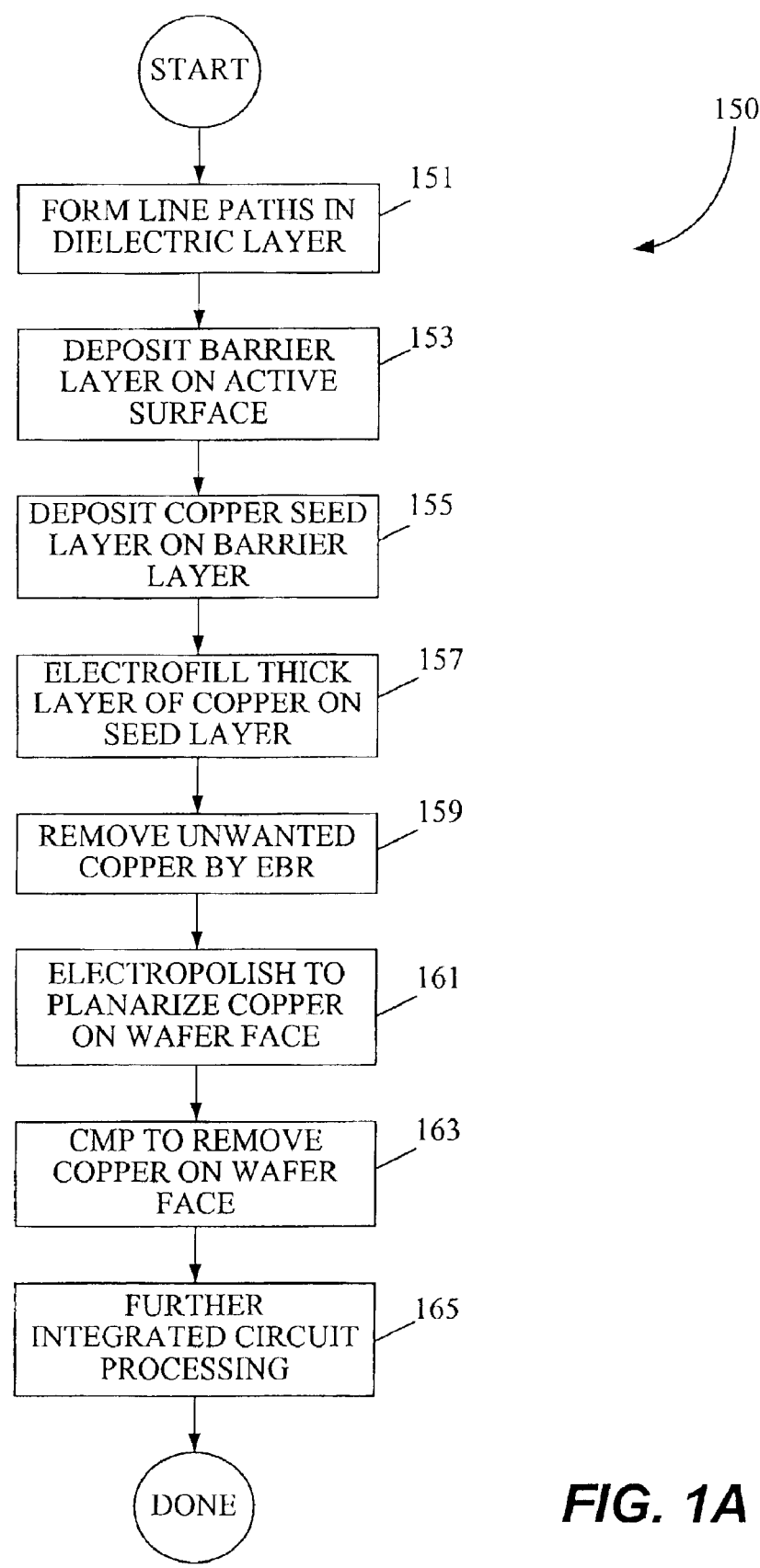
FIG. 1A is a process flow diagram illustrating relevant operations employed to form conductive copper lines in the context of a Damascene process of this invention.

While details of the preferred embodiment are presented below in this application, a short description of a typical Damascene process will now be provided to facilitate understanding the context of the present invention. A process flow 150 is illustrated in the flowchart of FIG. 1A. Process 150 begins with formation of line paths 151 in a dielectric layer. These line paths may be etched as trenches and vias in a blanket layer of dielectric such as silicon dioxide. They define conductive routes between various devices on a semiconductor wafer. Because copper or other conductive material provides the conductive paths of the semiconductor wafer, the underlying silicon devices must be protected from metal ions (e.g., copper) that might otherwise diffuse into the silicon. To accomplish this, the process includes depositing a thin diffusion barrier layer 153 before depositing the metal. Suitable materials for the diffusion barrier layer include tantalum, tantalum nitride, tungsten, titanium, and titanium tungsten. In a typical embodiment, the barrier layer is formed by a PVD process such as sputtering.

The wafer is now nearly ready to have its line paths inlaid with the electrofill copper. However, before electrofilling, a conductive surface coating must be applied. In the depicted process, this is accomplished by depositing a copper seed layer on the barrier layer at 155. A PVD process such as sputtering may be employed for this purpose. The wafer is then electrofilled at 157 with a thicker layer of copper by electroplating onto the the seed layer. The copper is deposited to a thickness that completely fills the various line paths in the dielectric layer.

An additional step of removing unwanted copper from the edge of the wafer surface may be performed by the edge bevel removal and/or backside etch processes. With edge bevel removal at 159, a copper etchant is applied to the front edge of the wafer in a thin stream. The etchant is preferably applied under viscous flow conditions so that it remains in a thin, viscous layer near the point on the wafer where it is applied, and thus avoids splashing the interior of the wafer. More details of the edge bevel removal process are provided in U.S. patent application Ser. No. 09/557,695 filed on Apr. 25, 2000, naming Mayer et al. as inventors and titled "ETCHANT MIXING SYSTEM FOR EDGE BEVEL REMOVAL OF COPPER FROM SILICON WAFERS." That application is incorporated herein by reference for all purposes.

After edge bevel removal, the electroplated copper may be electropolished to planarize it as indicated at 161. In a specific embodiment, the electropolishing is performed using a diffusion barrier film to facilitate planarization. See U.S. patent application Ser. No. 09/412,837 filed on Oct. 5, 1999, naming Mayer et al. as inventors and titled "ELECTROPLANARIZATION OF LARGE AND SMALL DAMASCENE FEATURES USING DIFFUSION BARRIERS AND ELECTROPOLISHING". That patent application is incorporated herein by reference in its entirety and for all purposes.

Following planarization by electropolishing, any remaining copper or barrier layer laying above the top of the underlying dielectric layer is removed by, for example, chemical mechanical polishing (CMP) or chemical etching. See 163. After the copper has been removed down to the level of the dielectric (to provide inlaid copper lines), further processing (illustrated at 165) is performed. This generally includes the formation of subsequent dielectric layers and metal lines. Note that the present invention may be advantageously employed in either or both of steps 157 and 161 (electroplating and electropolishing).

Figure 1B:
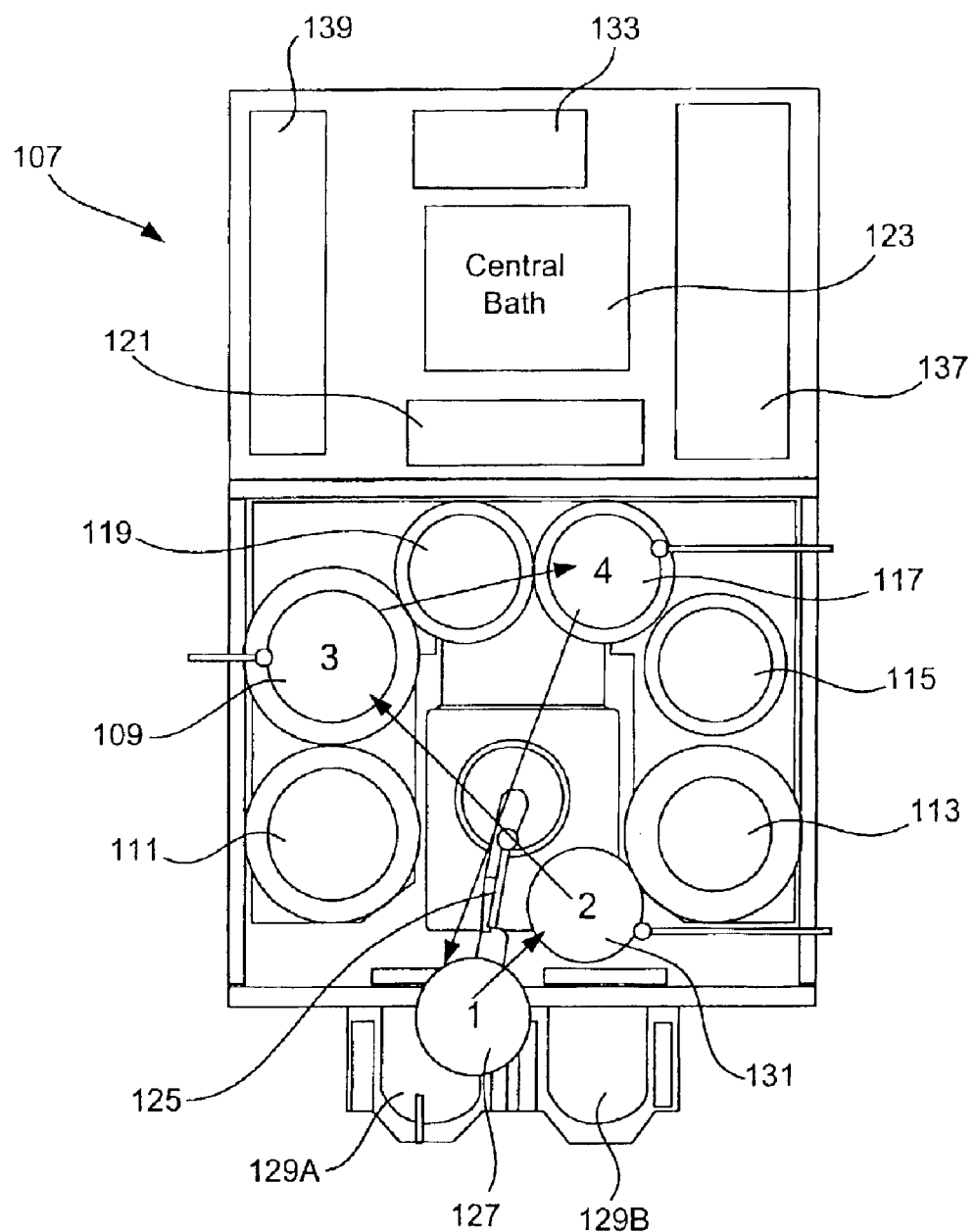
FIG. 1B is a block diagram illustrating a group of modules used to form copper conductive lines on an integrated circuit.

FIG. 1B depicts an electrofill system 107, which may utilize this invention. The specific system includes three separate electrofill modules 109, 111 and 113. One or more of these may be an electroplating module of this invention. System 107 also includes three separate post electrofill modules 115, 117 and 119. Each of these may be employed to perform various functions such as edge bevel removal, backside etching, and acid cleaning of wafers after they have been electrofilled by one of modules 109, 111, and 113. System 107 also includes a chemical dilution module 121 and a central electrofill bath 123. Bath 123 is a tank that holds the chemical solution used as the electroplating bath (catholyte) in the electrofill modules. System 107 also includes a dosing system 133 that stores and delivers chemical additives for the plating bath. The chemical dilution module 121 stores and mixes chemicals to be used as the etchant in the post electrofill modules. A filtration and pumping unit 137 filters the plating solution for central bath 123 and pumps it to the electrofill modules. Finally, an electronics unit 139 provides the electronic and interface controls required to operate system 107. Unit 139 may also provide a power supply for the system, such as a DC or pulse plating power supply.

In operation, a robot including a robot arm 125 selects wafers such as a wafer 127 from a wafer cassette such as a cassette 129A or a cassette 129B. Robot arm 125 may attach to wafer 127 using a vacuum attachment.

To ensure that wafer 127 is properly aligned on robot arm 125 for precision delivery to an electrofill module, robot arm 125 transports wafer 127 to an aligner 131. In a preferred embodiment, aligner 131 includes alignment arms against which robot arm 125 pushes wafer 127. When wafer 127 is properly aligned against the alignment arms, the robot arm 125 moves to a preset position with respect to the alignment arms. It then reattaches to wafer 127 and delivers it to one of the electrofill modules such as electrofill module 109. There, wafer 127 is electrofilled with copper metal. Electrofill module 109 employs electrolyte from a central bath 123.

After the electrofill operations are complete, robot arm 125 removes wafer 127 from electrofill module 109 and transports it to one of the post-electrofill modules such as module 117. There unwanted copper from certain locations on the wafer (namely the edge bevel region and the backside) is etched away by an etchant solution provided by chemical dilution module 121, and the wafer is rinsed with deionized water and dried.

After processing in post electrofill module 117 is complete, robot arm 125 retrieves wafer 127 from the module and returns it to cassette 129A. From there the cassettes can be provided to other systems such as a chemical mechanical polishing system for further processing.

Electrofill Apparatus and Operation

Figure 2:
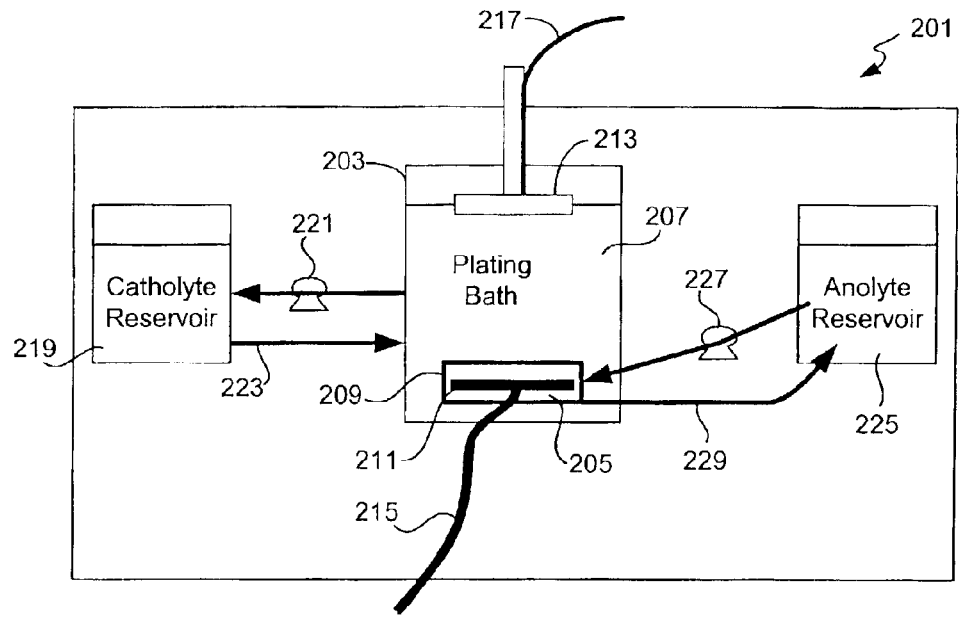
FIG. 2 is a block diagram of an electroplating system of this invention in which anolyte and catholyte are independently circulated between a plating region and reservoirs located outside the plating region.

FIG. 2 provides a general block diagram of an electroplating system 201 in accordance with one preferred embodiment of this invention. An electroplating compartment 203 includes an anode chamber 205 and a cathode chamber 207. The anode chamber 205 is defined by a chemical transport barrier 209 enclosing an anode 211.

Anode chamber 205 includes an anolyte solution associated with the anode. Cathode chamber 207 forms, in this embodiment, the major chamber of electroplating compartment 203. It contains a "plating bath" associated with a cathode 213. Thus, the plating bath serves as a catholyte. In a preferred embodiment, cathode 213 is a semiconductor wafer having trenches etched on its surface for Damascene processing. During electroplating, an electrical field is established between anode 211 and cathode 213. This electrical field drives positive ions from anode chamber 205 through barrier 209 and cathode chamber 207 and onto cathode 213. At cathode 213, an electrochemical reaction takes place in which positive metal ions are reduced to form a solid layer of metal on the surface of cathode 213. In a preferred embodiment, the metal ions are copper ions and copper metal is deposited into the trenches on a semiconductor wafer, bottom-up. In many designs, the cathode/substrate rotates during electroplating.

Anode 211 may be made from either a sacrificial metal such as copper or a dimensionally stable metal such as titanium or platinum. An anodic potential is applied to anode 211 via an anode electrical connection 215. Typically this connection includes a lead formed from a corrosion resistant metal such as titanium or tantalum. Cathodic potentials are provided to cathode 213 via a lead 217, which may also be made from a suitable metal.

As indicated above, a primary purpose of porous membrane 209 is to maintain a separate chemical and/or physical environment in anode chamber 205 and cathode chamber 207. Most importantly, membrane 209 should be designed or selected to largely prevent non-ionic organic species from entering anode chamber 205. More specifically, poison forming organic additives should be kept out of anode chamber 205. Further details of porous membrane 209 will be provided below.

The catholyte may be circulated between cathode chamber 207 and a catholyte reservoir 219. The temperature and composition of the catholyte may be controlled within catholyte reservoir 219. For example, one can monitor and control the level of non-ionic plating additives within reservoir 219. Gravity can enable the return of excess catholyte out of cathode chamber 207 and into catholyte reservoir 219. Treated catholyte from reservoir 219 may then be directed back into cathode chamber 207 by a pump 21 via a line 223.

In integrated circuit fabrication, plating operations may be performed in parallel on multiple wafers using multiple electrofill modules as illustrated in FIG. 1B. In such cases, a central plating bath reservoir may supply multiple electroplating compartments. For example, catholyte reservoir 219 may correspond to electrofill bath 123 in FIG. 1B and electroplating compartment 203 may correspond to one of the three separate electrofill modules 109, 111 and 113. Thus, catholyte reservoir 219 may supply catholyte to multiple plating cells. In a specific example, anode chamber 205 has a volume of about 3 liters, cathode chamber 207 has a volume of about 15 liters, and catholyte reservoir 219 has a volume of about 150 liters, enough to supply multiple plating cells.

The anolyte in anode chamber 205 may be stored in and replenished from an anolyte reservoir 225. In this example, the anolyte system (compartment 205, reservoir 225 and the connecting plumbing) is an "open loop" system because the anolyte volume within the system can change; specifically, the anolyte volume in reservoir 225 can change. Examples of closed loop systems will be described below.

A pump 227 draws the anolyte from reservoir 225 into anode chamber 205. In some embodiments, flow is directed over the anode surface to facilitate mixing. Anolyte from chamber 205 may be recycled back to reservoir 225 via a line 229. The temperature and composition of the anolyte may be controlled within reservoir 225. In a specific embodiment, the concentration of copper ions in chamber 205 may be limited so that it does not reach saturation. As explained in more detail below, when copper ions are produced at the anode and when hydrogen ions are used to carry substantial current across the porous membrane (as a supporting electrolyte), the concentration of copper ions within the anode chamber can increase to a high level and cause precipitation. Thus, there may be a need to introduce fresh dilute solution from reservoir 225 into chamber 205.

Figure 3:
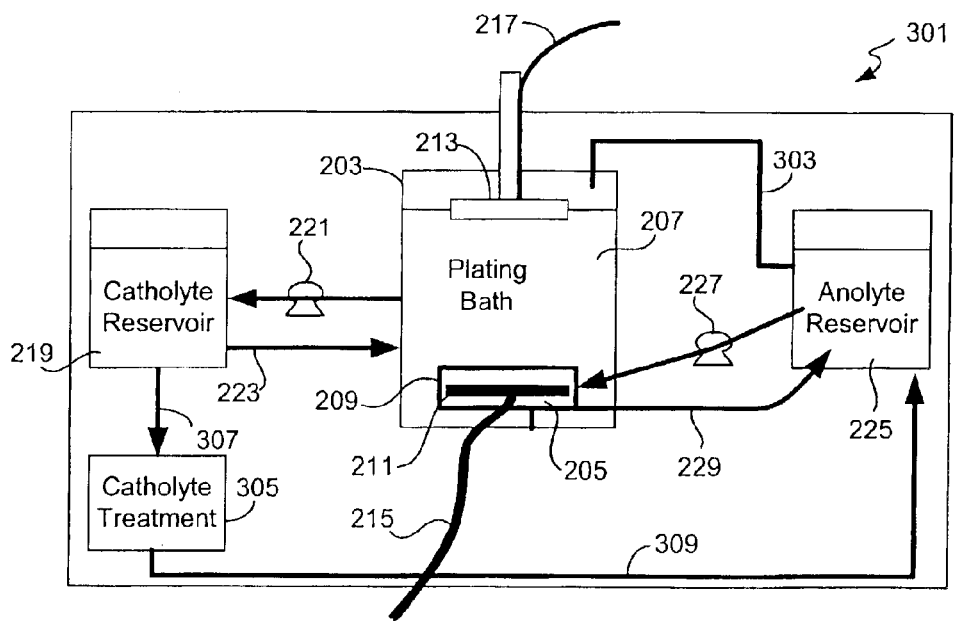
FIG. 3 is a block diagram of another electroplating system of this invention in which anolyte from the anode chamber is delivered to the cathode chamber via a flow conduit, and catholyte from cathode chamber is treated to remove additives and then provided to the anode chamber.

Another preferred embodiment is depicted in FIG. 3. In this embodiment, a system 301 includes many components that are identical or very similar to counterpart components in the embodiment depicted in FIG. 2. In FIGS. 2 and 3, like reference numerals represent like components. The embodiment of FIG. 3 is specifically designed to address the potential problem of increasing copper ion concentration in anode chamber 205. In this embodiment, a concentrated copper ion solution from anode reservoir 225 is fed into cathode chamber 207 via a line 303. And diluted electrolyte solution with plating additives removed via a catholyte treatment apparatus 305 is provided to reservoir 225 via a line 309. This serves to reduce the concentration of copper ions within chamber 205 and increase the concentration of copper ions in the catholyte. When anolyte solution is transferred from anode reservoir 225 to cathode chamber 207, an increase in the catholyte volume occurs. One way to handle this issue is to simply dump the excess catholyte. Alternatively, the excess volume, which is to be removed from catholyte reservoir 219, may be recycled. In the depicted embodiment, the catholyte from reservoir 219 is treated to remove the organic additives as part of the recycling process.

In the embodiment depicted in FIG. 3, excess catholyte from reservoir 219 is directed into a catholyte treatment apparatus 305 through a flow line 307. In a preferred embodiment, catholyte treatment apparatus 305 employs activated carbon filtration and/or reverse osmosis apparatus to remove essentially all of the organic additives from the catholyte. Activated Carbon filters are widely used. One suitable filter is the Model CBC-20 available from U.S. Filters Corporation, Plymouth Products division of Sheboygan, Wis.

With the organic additives (including any breakdown products) removed from the catholyte bleed, the material can be recycled into the anode reservoir 225 via line 309. This greatly reduces waste generation while still maintaining high performance plating.

As mentioned, one engineering issue that may have to be addressed in the embodiments of this invention is preventing copper ion concentration from reaching saturation in the anode chamber. In the case of a dissolvable metal anode (e.g. a copper anode) the metal ion is produced in the anode chamber as discussed above. Furthermore, when the only positive ions present in anolyte are those of the metal being plated, then the metal ion and its anionic counter ion carry all the electrical current through the electrolyte. Under these circumstances, no substantial buildup to copper ion is expected in the anode chamber. However, when a substantial amount of supporting electrolyte (e.g. an acid) is part of the anolyte (typically added to increase the electrical conductivity of the electrolyte), the hydrogen ion will carry a majority of the current through the anode membrane (due to its much higher specific conductance and ionic mobility). See, for example, A. Bard and L. Faulkner, "Electrochemical Methods: Fundamental and Application", pg 64 et seq., John Wiley and Sons, New. York 1980. Under these circumstances, copper ion may accumulate in the anode chamber and reservoir and be depleted from the plating bath and catholyte reservoir. Therefore, under certain conditions (e.g. anolyte composition, porous membrane porosity, pore size, and thickness, anode chamber pressure, and anode material of construction), it may be necessary to reduce the copper concentration in the anolyte chamber to avoid the solution from becoming saturated during the plating operation. If the anode chamber becomes saturated with copper, precipitation of copper salt on the anode can occur, increasing the resistance to further current flow and "passivating" the anode.

There are various preferred methods of avoiding this circumstance: 1) add fresh, lower copper concentration anolyte to the reservoirs and chamber, 2) remove concentrated anolyte material from the anolyte (see FIG. 3), 3) using a copper free (e.g. acid) or low copper electrolyte or 4) using a combination of a copper concentration and membrane porosity such that a steady state can be obtained between migration and diffusion of copper through the membrane at a concentration below the saturation level (see FIG. 4A discussed below). Essentially, a trade off must be made between the desired level of organic additive separation and the effective buildup of copper in the anode chamber.

Figure 4A:
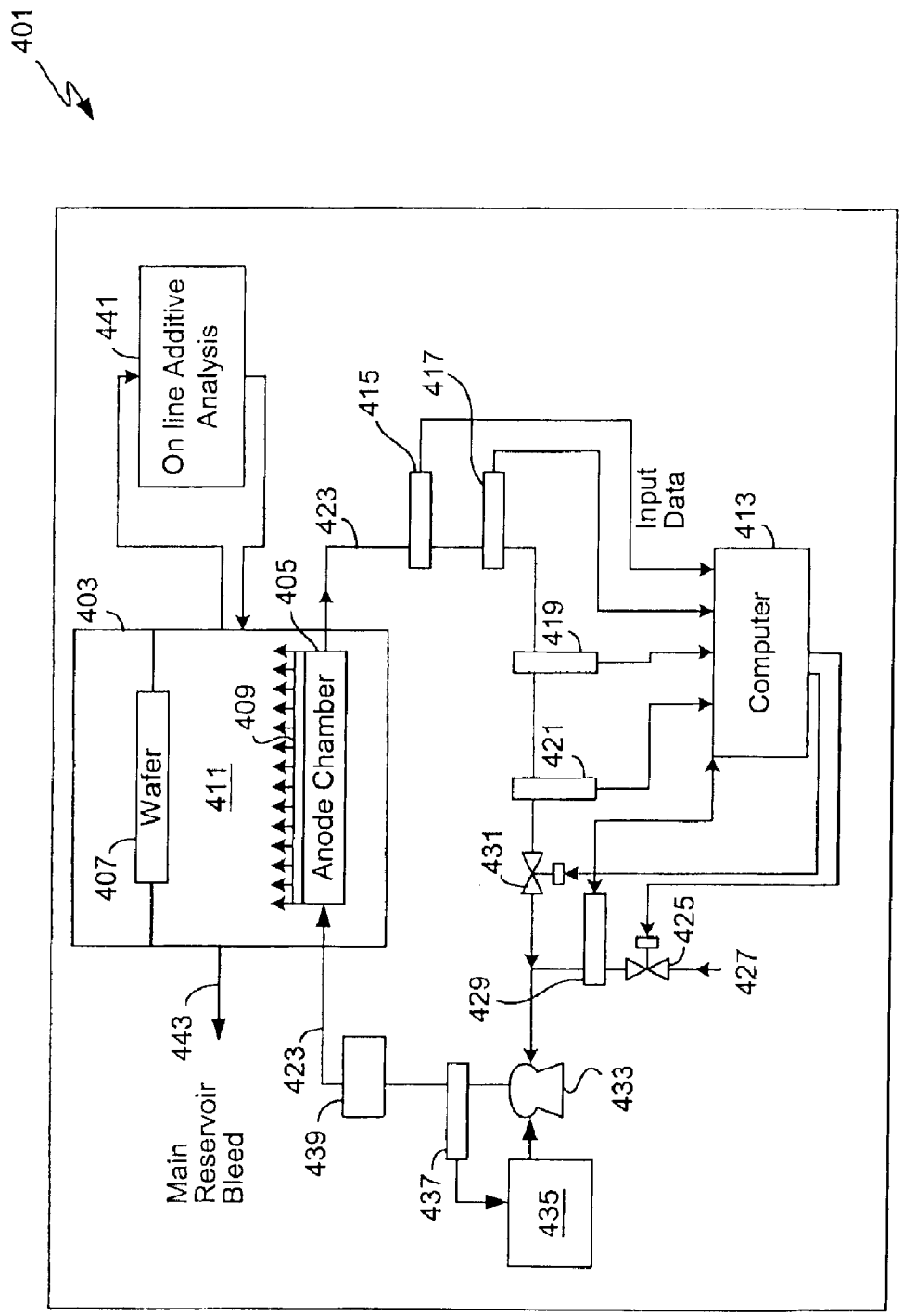
FIG. 4A is a block diagram of yet another electroplating system of the invention in which a controlled amount of anolyte is permitted to flow into the cathode chamber via a transport barrier defining the anode chamber.

FIG. 4A presents an embodiment in which a small amount of concentrated copper salt solution from the anode chamber moves to the cathode chamber across a "leaky" porous membrane defining the anode chamber. In this embodiment, fresh, additive-free bath is provided to the anode chamber. Further, the anode chamber itself acts as the reservoir for anolyte. No separate anolyte reservoir is required, saving space, improving safety, and reducing cost. The rate of flow of anolyte into the cathode chamber (and catholyte reservoir) will be a function of the pressure across the porous membrane surrounding the anode chamber. Note that unlike the anolyte subsystems of FIGS. 2 and 3, the anolyte subsystem of FIG. 4A is a closed loop; the volume of anolyte cannot change because there is no "open" anolyte reservoir.

In FIG. 4A, an electroplating system 401 includes a main cathode reservoir 403 having an anode chamber 405 and a wafer (cathode) 407. Anode chamber 405 is surrounded by a transport barrier 409 which allows a small fluid flux out of chamber 405 and into a catholyte 411 (main plating bath). Suitable properties of membrane 409 and system parameters facilitating such flux are described below in the "separator" section.

A computer 413 monitors the composition and flow parameters of anolyte circulated through anode chamber 405. Computer 413 receives inputs from various sensors including a conductivity sensor 415, a pressure sensor 417, a density sensor 419, and an optical sensor 421. All of these are provided on an anolyte recirculation line 423. Optical sensor 421 can provide the concentration of color imparting ions such as cupric ions. Conductivity sensor 415 and density sensor 419 can together provide the acid concentration, when the copper concentration is known. Pressure sensor 417 provides the differential pressure across membrane 409. Knowledge of the concentration(s) in the anolyte, the pressure in the chamber, and the flow/pressure relationship enables determination of the transfer rate of material from anode chamber 405, across membrane 409 to the main cathode reservoir 403. This information enables overall control of acid and copper in the system as a whole.

Because membrane 409 is designed to provide a small positive flux out of anode chamber 405, some fresh makeup anolyte must be added periodically or continuously. Based on the detected concentration and pressure of electrolyte flowing through recirculation line 423, computer 413 can calculate the amount of makeup anolyte to provide. In the example shown, computer 413 controls a makeup control valve 425, which controls the amount of fresh makeup solution 427 (e.g., additive free copper sulfate solution) injected into line 423. A pressure sensor 429 in communication with computer 413 monitors the flow of makeup anolyte 427. Note that makeup solution 427 may be catholyte in which additive has been removed, provided from catholyte treatment filter 305, for example. Alternatively, makeup solution 427 comes from fresh stock. Note that line 423 also includes a pressure control valve 431 controlled by computer 413. By controlling valves 425 and 431, computer 413 can accurately adjust the relative amounts of recirculated anolyte and fresh anolyte. In a specific embodiment, the system provides about 3 to 4 milliliters of makeup anolyte per minute per cell. This represents the volume of anolyte leaking across of membrane 409.

The anolyte flow through recirculation line 423 may be maintained by a variable speed pump 433 acting under the control of a flow controller 435. Flow controller 435 receives volumetric or mass flow data from a flow sensor 437 positioned on line 423. One can use flow pump 433 (together with flow sensor 437 and flow controller 435) to increase or decrease the pressure in anode chamber 405 by opening or closing valve 431 in the circulation loop. As the pressure decreases downstream of the pump, fresh materials (makeup 427) can be added to maintain fluid in the circulation loop. As the concentration increases in the anode chamber or decreases in the main reservoir, pressure can be increased to increase the flow of material and balance the system's copper and acid content. Using this type of arrangement, the amount of required additive are reduced and the amount of dumping is substantially reduced over the current state of the art.

Note that line 423 also includes a particulate filter 439 that separates particulates from anolyte. Particulates are commonly generated at the anode in copper electroplating systems.

Catholyte 411 is monitored by an on line additive analysis module 441 which can monitor, in one embodiment, copper ion concentration, hydrogen ion concentration, and organic additive composition and concentration. In a specific embodiment, hydrogen ion concentration is monitored by neutralization and suppressor and accelerator concentrations are measured by cyclic voltammetry.

Because there is a net flow of electrolyte from anode chamber 405 into catholyte 411, the volume of catholyte can increase in main cathode reservoir 403. Thus, some mechanism must be provided to bleed excess catholyte from main cathode reservoir 403. In the depicted embodiment, catholyte is bled out via a line 443. From there the excess catholyte may be dumped or provided to a main plating bath. Alternatively, as indicated above, the excess catholyte may be treated to remove additives and then provided as makeup anolyte 427.

During high acid operation, it may be also become necessary to increase the concentration of copper in the catholyte chamber because copper is being plated at the cathode, but not replenished because of the transference number difference between acid and copper across the transport barrier. Therefore, a particularly preferred embodiment involves transferring high copper anolyte to the catholyte chamber and reservoir, accompanied by an addition of the nominal amount of required organic additives to the catholyte to maintain the organic concentrations, and simultaneously adding lower copper concentration electrolyte to the anolyte chamber. In some embodiments, the low copper electrolyte has the same concentration of acid and copper as in the catholyte reservoir. In another embodiments, the lower copper electrolyte is treated catholyte as discussed above.

Figure 4B:
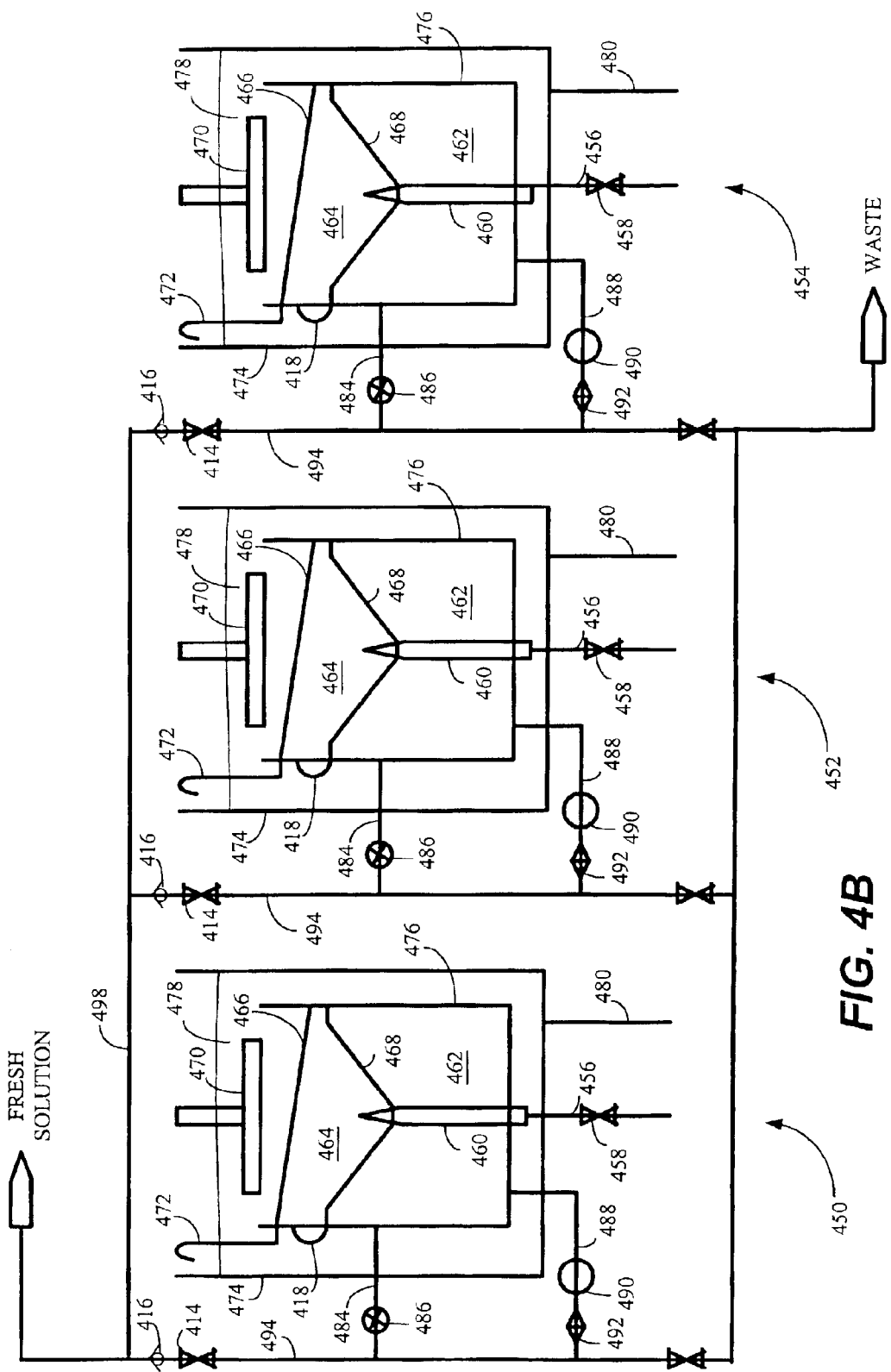
FIG. 4B is a block diagram of multi-module system having three separate plating modules and a single catholyte reservoir.
Figure 4C:
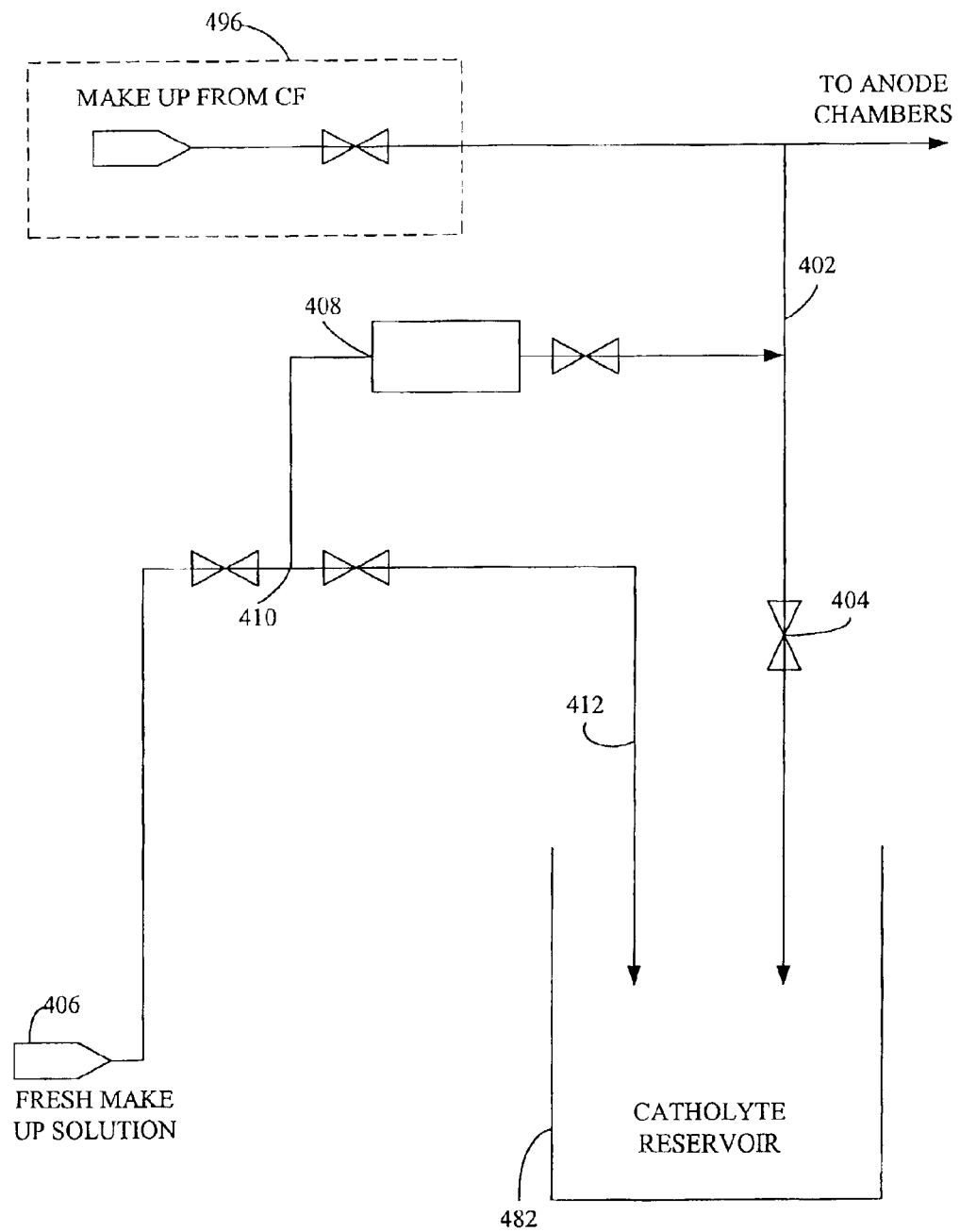
FIG. 4C is a block diagram depicting a system for providing anolyte and catholyte to the plating modules shown in FIG. 4B.

FIGS. 4B and 4C depict a system having 3 separate plating modules all from the same catholyte reservoir and the same anolyte source. In the depicted embodiment, each of plating modules 450, 452, and 454 receives catholyte via a line 456 controlled by an inlet valve 458. The catholyte enters the plating modules via an catholyte inlet tube 460, which extends vertically through an anode chamber 462.

The catholyte enters the plating module in a diffuser manifold 464. Manifold 464 is bounded on the top by a diffuser membrane 466 and on the bottom by a porous membrane 468 (transport barrier). Membrane 468 also defines the upper bounds of anolyte chamber 462. Catholyte passes upward through diffuser membrane 466 and contacts wafer 470. Diffuser membrane 466 causes the catholyte to flow upward in a uniform manner as it contacts wafer 470. This upwardly uniform flow promotes even plating over the surface of wafer 470. Note that membrane 466 is tilted slightly upward to the left. This causes bubbles that accumulate within diffuser manifold 464 to concentrate under membrane 466 at the left side of the plating module. There, the gas bubbles escape from the plating module via a gas removal tube 472.

In a preferred embodiment, diffuser membrane 466 is made from a porous polymeric material such as sintered polypropylene, sintered polyethylene, or Kynar. However, the diffuser membrane 466 can be made of a microporous glass, ceramic or other chemically compatible membrane material with an average pore size of from about 25 to 200 microns, a thickness of about ⅛ to ½ inches, and a void fractions of 30–70%. One example of a suitable diffuser membrane is Portex Corporation course grade polyethlene or polyproplyene sheet. In the depicted embodiment, each of the plating modules contains an outer housing 474 and an inner housing 476. Catholyte 478 attains a level over the top of inner housing 476. This allows the catholyte to flow out of the plating module via an outlet 480 on the bottom of outer housing 474. Catholyte flowing out of the plating modules returns to a main plating bath 482 (corresponding to block 123 of FIG. 1B). Organic additives are provided to the catholyte in reservoir 482 as needed. Note that FIGS. 4B and 4C do not show the flow lines connecting reservoir 482 to inlet line 456 and outlet 480. Note also that the system includes a pump (not shown), which allows the catholyte to continuously circulate through the three plating modules.

Anolyte flows into anode chamber 462 via a line 484 having a flow meter 486. Anolyte is removed from chamber 462 via a line 488, drawn by a pump 490. The flowing anolyte passes through a filter 492, which removes particles as small as a fraction of a micrometer. Anolyte passes back to inlet line 484 via a line 494. Pump 490 causes anolyte to continuously flow within chamber 462. This provides for the necessary convection during electrochemical dissolution of the anode and also allows for continuous filtration of the particles, which are inevitably generated.

During plating, some copper in the catholyte is consumed. A mass balance (which is based upon the amount of current passed in a given time) will indicate how much copper has been consumed. Given that concentration varies directly with the amount of copper plated, some mechanism must be maintain the desired anolyte concentration. In the depicted embodiment, fresh anolyte is provided as make up solution from one of two units. In one embodiment, the make up solution is provided via a carbon filtration unit 496, which filters organic compounds out of the catholyte. The make up solution from this source is delivered via a line 498 to line 494. The make up solution is also periodically delivered to main plating reservoir 482 via a line 402. A valve 404 controls delivery of the make up solution to reservoir 482.

In an alternative embodiment, the make up solution is provided from a fresh source that does not involve carbon filtration. This is depicted as a source 406, which provides the solution to line 402 via a "totalizer" 408. Totalizer 408 includes one or more flow meters, which meter the doses of anolyte. Make up solution from source 406 may also be delivered to reservoir 482 via valves 410 and a line 412.

When make up solution anolyte is delivered to line 498, it enters one of the three plating modules, 450, 452, and 454 depending upon which of valves 414 is opened at any given moment. Whichever one of the valves is open allows a metered dose of make up solution to enter anode chamber 462 via line 484. Note that lines 494 include check valves 416 to prevent make up solution from flowing in the reverse direction.

Anode chamber 462 communicates with diffuser manifold 464 via a gas removal tube 418. Gas removal tube 418 allows bubbles that collect under the edges of anode chamber membrane 468 to enter diffuser manifold 464, where they can be removed via gas removal tube 472. In addition, tube 418 allows small quantities of anolyte to enter diffuser manifold 464 during the anolyte dosing operation. Concentrated copper is transferred from the anolyte chamber 462 into the diffuser manifold 464 through tube 418 as lower copper concentration electrolyte enters the anode chamber through line 494. In a preferred embodiment, membrane 468 is designed to allow essentially no bulk fluid transport from anode chamber 462 to diffuser manifold 464. An example of one such design is the tri-layer membrane described below.

Figure 5A:
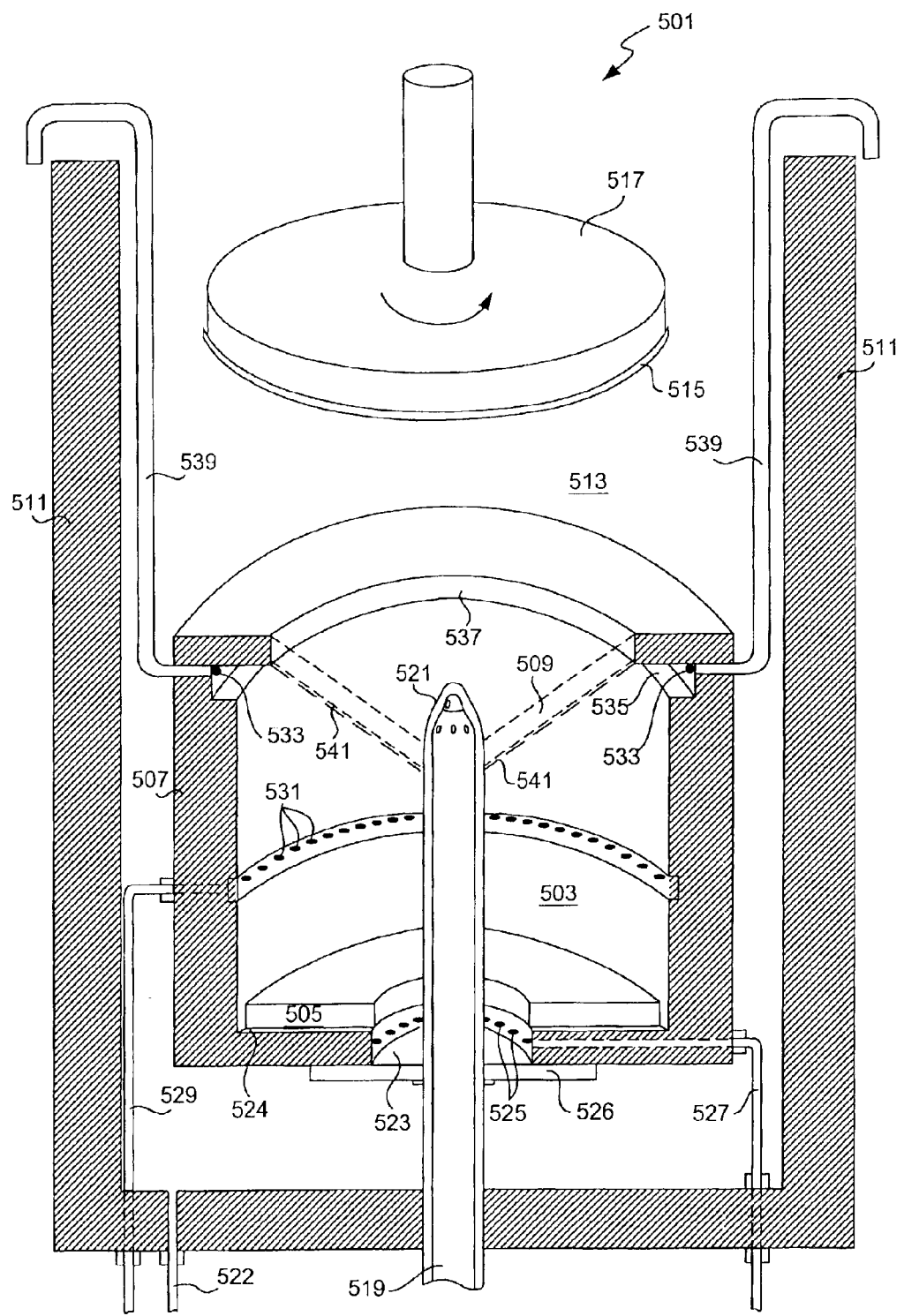
FIG. 5A is a cut-away diagram of an electroplating chamber in accordance with a preferred embodiment of this invention.
Figure 5B:
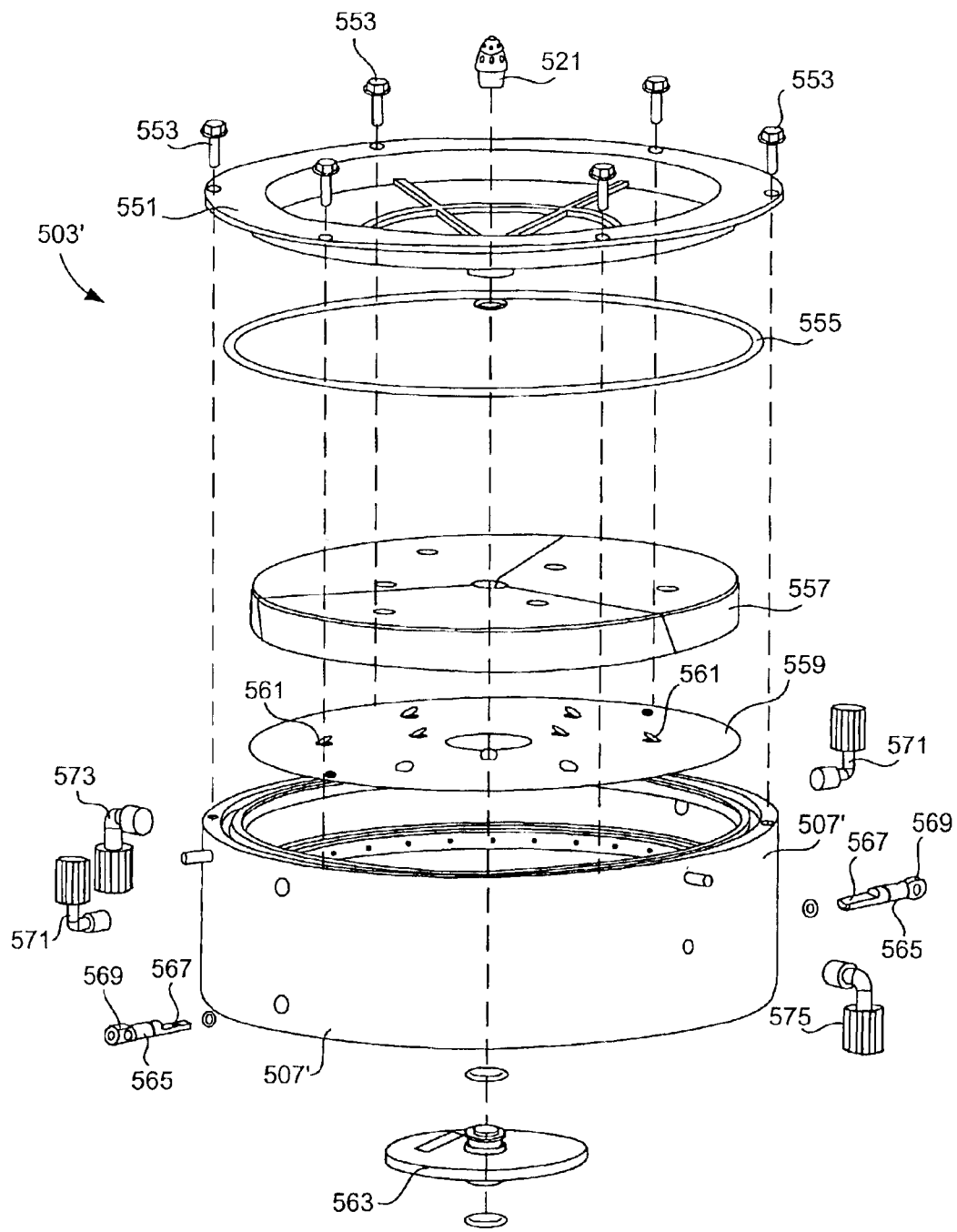
FIG. 5B is an exploded view of a portion of an apparatus related to that shown in FIG. 5A.
Figure 5C:
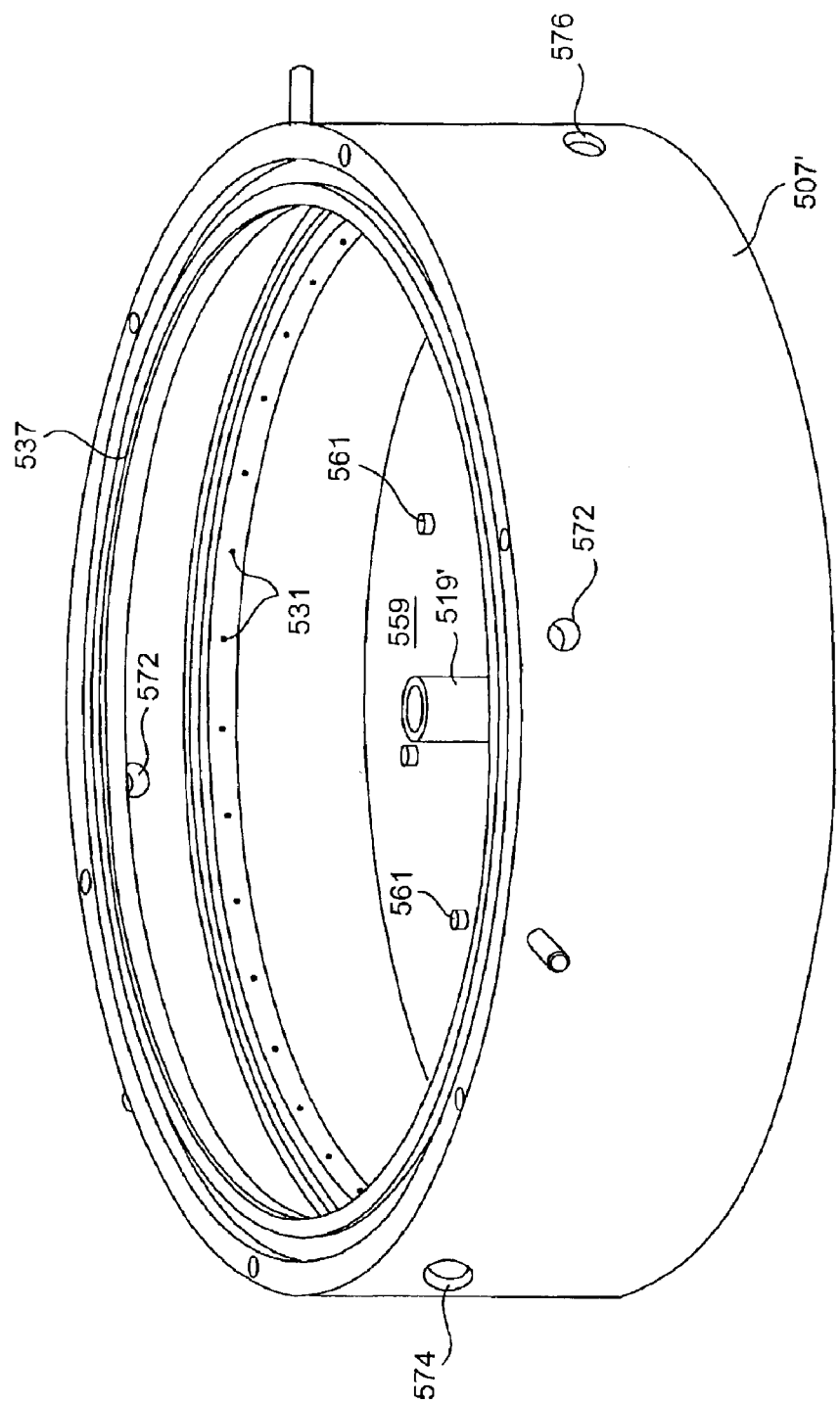
FIG. 5C is a perspective view of a portion of the apparatus shown in FIG. 5B.

FIGS. 5A, 5B, and 5C depict a specific preferred plating apparatus structure in accordance with this invention. FIG. 5A is a cut-away view of an electroplating apparatus 501 including a cylindrical anode chamber 503 and associated disk-shaped the anode 505. FIG. 5B is an exploded view of a portion of a related apparatus and FIG. 5C is a perspective view of a portion of apparatus shown in FIG. 5C. Anolyte is kept within anode chamber 503. Anode chamber 503 is defined by a cylindrical rigid frame 507 and a diffusion barrier membrane 509 attached to the top of frame 507. Membrane 509 is shaped as an inverted cone and serves as the ceiling of the anode chamber.

A main chamber 511 of apparatus 501 contains a catholyte (plating bath) in a cathode region 513 outside of anode chamber 503. A cathode 515 (wafer or other substrate) is mounted on a rotatable cathode holder 517 so that cathode 515 can be rotated in the catholyte during electroplating. Catholyte is supplied to cathode region 513 by a catholyte inlet line 519 passing through the center of anode chamber 503 and anode 505. The distal end of line 519 contains a shower spout 521 having a plurality of outlet holes that distribute catholyte equally in various directions into region 513. Catholyte exits through a catholyte outlet 522 in chamber 511. Main chamber housing 511 is made from a rigid material that is resistant to chemical and electrochemical degradation from the plating bath. In a specific embodiment, it is made from a polymeric material such as polypropylene, polyethylene, polytetrafluoroethylene, or polyvinylidene diflouride. In a specific embodiment, it has a diameter of between about 0.3 and 0.5 meters and a height of between about 0.3 and 0.5 meters.

As mentioned, anode chamber 503 includes a rigid cylindrical frame 507 and a conical porous diffusion membrane 509. As shown, anode 505 rests on a current bus 524 in the bottom of cylindrical frame 507. Current bus 524 provides current to anode 505 to allow electroplating to proceed. Inner frame 507 has an aperture 523 located in the center of its bottom. This allows catholyte line 519 to pass through it. A plate 526 seals the bottom of anode chamber 203, below aperture 523. Around the perimeter of aperture 523 is a plurality of anolyte outlet holes 525. Anolyte is supplied to an external compartment (e.g., an anolyte reservoir) or to an anolyte recirculation line from outlet holes 525 via an anolyte outlet line 527.

Anolyte is supplied to chamber 503 from an external source (e.g., the anolyte reservoir) through an anolyte inlet line 529. Line 529 exits through a plurality of anolyte inlet holes 531 disposed about a perimeter ring in the interior of frame 507. In an alternative embodiment, anolyte inlet holes are disposed at another location on the perimeter of chamber housing 507 (e.g., near the top of housing 507). In a preferred embodiment, anolyte is introduce to anolyte chamber 503 via one or more slots (instead of inlet holes 531) that surround the circumference of housing 507 (preferably near the location of holes 531). In a particularly preferred embodiment, the slots are covered by a diffuser membrane that facilitates anolyte flow over anode 505 and toward outlet aperture 523. The membrane may be constructed of a porous polymeric material for example.

Bubbles sometimes must be removed from within anode compartment 503. If these are not removed, they can interfere with plating by displacing anolyte within compartment 503 and modifying the electric field in the electrolyte. To address this concern, gas outlet ports 533 are provided about a grove 535 near the top of frame 507. The upper edge of grove 535 (and frame 507) is defined by a lip 537. Bubbles formed within anolyte chamber 503 rise within the chamber and encounter membrane 509, which, due to its conical design, directs them toward lip 537. Bubbles accumulating on the underside of lip 537 enter gas outlet ports 533. From there, gas escapes the plating apparatus 501 via gas outlet tubes or "snorkels" 539 passing through catholyte in region 513.

Anolyte chamber frame 507 is made from a rigid material that resists chemical and electrochemical attack from the anolyte under operating conditions. In a specific embodiment, the frame 507 is made from a material selected from one or more of the following: polyethylene, polypropylene, polyvinylidenedifluoride, and polytetrafluoroethylene. In a further specific example, frame 507 has a diameter of between about 0.2 and 0.35 meters (size to fit within frame 511) and a height of between about 0.2 and 0.5 meters.

Transport barrier 509 is mounted to catholyte inlet line 519 and lip 537, on top of frame 507. In one preferred embodiment, the inner surface of barrier 509 is lined with a layer of carbon absorbent material 541, which captures organic compounds that might pass through the membrane from the catholyte. Examples of suitable carbon layers include activated carbon felts and papers.

FIG. 5B provides an exploded view of some of the principal components used in cylindrical anode chamber 503' (similar to that depicted in FIG. 5A). As shown, the top of chamber 503' includes a membrane supporting member 551. This provides a support for membrane 509 and for catholyte nozzle 521. Supporting member 551 is bolted onto inner chamber frame housing 507' by various bolts 553. An O-shaped seal 555 serves as a gasket between supporting member 551 and inner chamber frame 507'. Note that FIG. 5C also depicts frame 507'. At the bottom of frame 507' is an anode spacer 563, which allows the whole anode chamber to be adjusted up or down with respect to the wafer in the plating module.

In the embodiment shown, a three-part disk-shaped anode 557 rests on a titanium current collection bus 559. Titanium bus 559 includes various contact tabs 561, which provide good electrical contact to anode 557. Two anode current connectors 565 connect to titanium bus 559 through frame 507'. Each connector 565 includes a flatted region 567 that mates with the titanium plate. In addition, each connector 565 includes a wire connection mechanism 569 including a hole that receives a titanium feed wire and a set screw which holds the wire in place.

Chamber 503' also includes two gas release fittings 571 that connect to the gas removal tubes such as tubes 418 or tubes 539 described above (FIGS. 4B and 5A). Also, an anolyte flow inlet 573 and an anolyte flow outlet 575 are provided. As shown in FIG. 5C, the gas release fittings 571 attach to frame 507' at holes 572. The anolyte flow inlet 573 attaches to the frame 507' at a hole 574. Further, the anolyte flow outlet 575 attaches to frame 507' at a hole 576. Note the portion of a catholyte inlet tube 519' rising above titanium current bus 559 as shown in FIG. 5C.

Separator Function, Composition, Structure

As mentioned, the separator should permit passage of ionic current but strongly restrict passage of certain non-ionic species such as organic plating additives. The separator materials should also be chemically compatible with the plating bath during extended operation. Preferably, the separator material is porous and allows passage of both anions and cations. Examples of suitable separator materials include porous glasses (e.g., glass frits made by sintering fine glass powder), porous ceramics (e.g., alumina and zirconia), silica areogel, organic aerogels (e.g. resorcinol formaldehyde areogel), porous polymeric materials, and filter membranes. Suitable porous ceramics, such as grade P-6-C can be obtained from Coorstek of Golden, Colo. For many suitable separator materials, the thickness, porosity, pore size, etc. can be adjusted to increase ionic conductance or decrease non-ionic diffusion. Generally, reducing the thickness and increasing porosity will increase the ionic conductance and, at the same time, increase the non-ionic diffusion. So some optimization and trade off will be required. In most applications, the thickness should be on the order of 0.15 to 3 centimeters, the porosity between about 25 and 85% void, and the average pore size should be small (0.1 to 20 micrometers).

In a specific embodiment, the porous membrane is a porous plastic such as Kynar, sintered polyethylene or polypropylene. This material is preferred because of its compatibility in construction with other plastic components. Preferably, the material has a porosity (void fraction) of about 25 to 85% by volume, with the average pore size ranging between about 0.5 and 20 micrometers. Further, the material has a thickness of between about 0.15 to 3 centimeters. Certain suitable porous plastics falling within this embodiment can be obtained from Portex Corporation of Fairburn, Ga. In one example, the sintered polyethylene or polypropylene is the "ultrafine" grade of porous sheet produced by Portex Corporation. In an especially preferred embodiment, the porous membrane is made from three separate layers of material: a thin small pore size material sandwiched between two thicker larger pore size sheets. In a specific embodiment, the thin small pore size material is a sheet of porous polyolefin (e.g., polyproplyene) having a thickness of approximately 10–50 micrometers (e.g., 25 micrometers) and an average pore size of less than about 0.5 micrometers (typically approximately 0.01 to 0.2 micrometers (e.g., 0.05 micrometers)). The first layer is a thin (typically 0.001 in thick) sheet of polymer with very small (<0.5 um). One suitable product is Celgard 2400 made by Celgard Corporation, a division of Hoechst, of Charlotte, N.C. The middle layer provides a large resistance to flow but allows good ionic conductivity. The outer two layers provide mechanical strength and extra resistance to flow, and a stagnant region where primarily only diffusion of non-ionic species can occur. In a preferred embodiment, these are sheets of sintered polyolefin having a thickness of between about ⅛ and ½ inches and an average pore size of approximately 5 to 20 micrometers (e.g., 10 micrometers). One example of a suitable material for the outer two layers is the "Ultrafine" grade sintered polyethylene sheet available from Portex Corporation. This three-layer design has been found to prevent substantially all anode particles from passing from the anode chamber to the main reservoir.

In general, a purpose of this three-layer construction is to achieve a membrane which allows both anions and cations to move freely through the membrane and have properties of minimal added resistance to electrical flow, but substantial resistance to fluid flow. The thin porous inner sheet creates a substantial resistance to fluid flow (due to the very small pores) and minimal resistance to current flow (due to its thinness). However, diffusion across this inner membrane would be great if used by itself (because of the small distance across the membrane). Also the membrane is flexible and weak and must be supported. The membrane is therefore affixed to two sintered porous polypropylene or polyethylene sheets of about ⅛" thick each. This sandwich has substantial mechanical strength allowing easy fabrication into a membrane housing. The sintered porous sheet creates a substantially thick region where little or no fluid movement occurs (because the pores are on the ~7 um scale and because there is a thin sheet of separator material below them which substantially allows no flow to pass through it). Therefore, the diffusion distance is substantially increase and the movement of non-charged species is prevented across the membrane. Thus, the membrane of this embodiment increases the flow resistance, thereby reducing the risk of flow "short circuiting" and concomitant additive exposure to the anode.

There may be cases in which the barrier's resistance to chemical transport is insufficient to completely prevent organic additives from entering the anode chamber. Very impermeable barriers (e.g., very small pore, low pore volume membranes) require large voltages to force ions across the membrane. Although such barriers effectively prevent organic compounds from entering the anode chamber, they force other constraints which may be unacceptable (e.g., high power use or heat generation). Therefore, a less restrictive barrier may be used in conjunction with an additional component can be added to the separator to capture some organic compounds passing into the anode chamber. For example, an activated carbon "filter" material may be placed between the anode and the separator, most preferably touching or in very close proximity to the separator. Layer 541 (FIG. 5A) is one example. When some organic material happens to pass through the separator, it is absorbed into the carbon filter. In this way the rate of diffusion to the anode is reduced by 1) diffusion restriction via the separator and 2) absorption into an activated carbon filter. Also, any detrimental decomposition products formed at the anode can be absorbed in the filter prior to passing back into the cathode chamber. The activated carbon filter can be of a number of designs such as carbon fiber cloth, activated carbon impregnated microporous polyproplyene, carbon aerogel sheets, and the like.

As mentioned in the discussion of FIG. 4A above, the separator membrane can be designed to "leak" slowly such that the additive-free anolyte will always be flowing (at a slow rate) into the main plating bath through the membrane. This mode of operation can be used to help manage the copper concentration in the anode chamber, and also substantially reduce the ability of additive to diffuse into the anode chamber. This is because the natural diffusion flux of additive into the anode chamber across the separator can be compensated for the mass flux (flow of matter) in the opposite direction.

$$v = x_a v_a + x_b v_b + x_c v_c \tag{1}$$

In this equation the total local velocity v of velocity of flow at some point within the separator is equal to the sum of the product of the individual species molar concentrations $x_i$ and their individual components mass average velocity $v_i$. In the case of additives, because its concentration is so low, its contribution to the total mass average velocity is small, and it is carried along with the other components. Therefore, the flux of additive associated with flow, $J_f$ is $$J_f = v x_{add} \tag{2}$$

In addition, the flux of additive is driven by the concentration variations of additive across the separator by diffusion.

$$J_d = D\rho(dx_{add}/dy) \tag{3}$$

Where $J_d$ is the diffusion flux of the additive, D is an effective diffusion coefficient (correcting for a porosity of the separator, etc) of additive in the plating bath solution in the separator, $x_{add}$ is the additive molar fraction at position y across the separator and ρ is the molar density of the solution. The net flux of additive into the chamber is zero when $J_f$ is equal to $J_d$ so $$V(min) = (D\rho(dx_{add}/dy))/x_{add} \tag{4}$$

V(min), the minimum velocity of fluid flow across the membrane to prevent additive from reaching the anolyte, is dependent on the membrane's properties (pore size, pore volume, etc) and electrolyte density, as well as pressure across the separator. D is dependent on the pore size and pore volume. Is we assume that there is a linear concentration variation of additives across the separator, then we can approximate equation 4 as $$V(\min) = (D\rho x_{bath}/t)/x_{bath} \quad (5)$$

Equation 5 shows that the necessary velocity of complete separation decreases with thickness t of the separator. By controlling the solution and separator properties, one can maintain acceptable power loss and heat generation, while keeping the additives substantially out of contact with the anode.

Catholyte, Anolyte, and Anode

Generally, the catholyte should promote good bottom-up electroplating on a silicon substrate. It should have good ionic conductivity, adequate metal ion concentration to ensure that metal deposition will not be concentration limited, and additives to promote bottom-up plating. The catholyte should be optimized for film quality, uniformity of deposition, and fill performance.

The components of a suitable catholyte generally include copper (or other deposition metal) ions, a supporting electrolyte such as acid (if necessary to improve conductivity), and "plating additives." Examples of plating additives include accelerators, suppressors, and levelers:

Suppressors generally provide a large change in the kinetic overpotential of the deposition reaction. This tends to give a more uniform current distribution over the surface of the wafer and thereby allows the copper deposition to proceed with a global leveling. The suppressors absorb strongly to copper and are not substantially consumed during the deposition reaction. Suppressors should be distinguished from levelers, which also increase the surface overpotential but which are consumed or altered during the deposition reaction. Typically suppressors are high molecular weight oxygen containing polymers such as polyethylene oxide, polypropylene oxide, co-polymers (random and block) of the monomers of the preceding polymers, and other strong surfactant molecules. Preferably, polymeric suppressors that may be used with this invention have a molecular weight of between about 1000 and 10,000 with concentrations of about 100–1000 parts per million by weight.

Accelerators (also referred to as catalysts or brighteners) are also strongly surface adsorbing and they compete with the suppressor molecules for surface sites on the deposited copper. The accelerators can alter the suppression process and tend to relatively accelerate the local plating process on the active surface of the copper seed layer. Often, accelerators arc sulfur containing, low molecular weight compounds such as mercaptopropane sulfonic acid (MPS), N-N-methyl dithiocarbonic acid (DPS), and dimercaptopropane sulfonic acid (SPS). Preferably a combination of accelerators and suppressors is used to obtain void free filling of high aspect ratio vias and trenches. Preferably, the accelerators that may be used with this invention are present in a concentrations of between about 0.5 and 25 parts per million by weight. Examples of other "additives" include surface agent such as wetting agent. Examples of wetting agents include sodium lauryl sulfate (e.g., between about 0–2% by weight), and various co-polymers of ethylene oxide (EO) and proplyene oxide (PEO).

In the context of copper electroplating catholytes, examples of suitable copper salts include copper sulfate, copper phosphate, copper pyrophosphate, copper perchlorate and copper salts of any other stable anion over the potential likely to be found in the copper plating operation. These are preferably present in the catholyte at a concentration of between about 10 and 50 grams of copper ion per liter of electrolyte, more preferably between about 18 and 40 grams of copper ion per liter. Typically, higher copper concentrations are used in combination with lower acid concentrations. Examples of supporting electrolyte include sulfuric acid, phosphoric acid, hydrochloric acid, and the like. A typical sulfuric acid supporting electrolyte is preferably present in the catholyte at a concentration of between about 0 and 250 gm/l weight percent, more preferably between about 10 and 180 weight percent.

Various commercially available copper plating baths are suitable for many embodiments of this invention. Examples of commercial copper plating solutions suitable for use with this invention include Ultrafill™ available from Shipley Ronal of Marlboro, Mass. and CuBath™ and Viaform™ available from Enthone OMI of New Haven, Conn. Both of these solutions contain non-ionic organic additives that facilitate bottom-up plating.

The anolyte contained in the anode chamber generally will have a composition similar to that of the catholyte but will be substantially free of non-ionic plating additives. Thus, the anolyte may be any desirable electrolyte solution, but preferably not containing any plating bath additives. When practical, it is also generally preferable that the anolyte contain a substantially lower acid concentration than the catholyte. To the extent that organic additives are present in the anolyte, the apparatus and methods of this invention should maintain them at concentrations below about 10% of that in the catholyte.

The anode is typically composed of pure copper and is substantially free of oxygen. In a preferred embodiment it contains from 0 to 1% atomic phosphorous, more preferably from 0.02 to 0.04% atomic phosphorous. Suitable materials can be obtained from Materials Research Corporation of Orangeburg, N.Y. This invention can also employ a dimensionally stable anode. Sometimes, however, a dimensionally stable electrode is not preferred for plating very small copper Damascene features. The rate of oxidation of plating bath additives is much greater in non-consumable configurations. This is because 1) there is no protective film on the anode to reduce the rate of oxidation and 2) the potential at the non-consumable anode is very high (substantially higher than the oxygen formation potential), leading to a high rate of degradation. In contract, the potential at the copper anode is less than 100–200 mV anodic of the copper equilibrium potential (much less oxidizing).

Further, formation of oxygen creates an electrolyte supersaturated with oxygen. Oxygen bubbles are constantly precipitating on the wafer being processed, creating defects in the locations where the bubbles form or attach themselves. Furthermore, the propensity of the electrolyte to oxidize the thin film of copper "seed" is substantially increased. Oxidation of the seed layer at the point of wafer entry into the plating bath is a serious problem. Therefore, copper active anodes are preferred in copper Damascene plating.

Anode convection in non-consumable anode designs is generally not important because the primary anode reaction is electrolysis (oxidation or water to form oxygen). The formation of bubbles causes substantial mixing. Also, the supply of reactant (water) is very high, and the limiting current for oxygen evolution is very high. Therefore, convection is not critical in non-consumable anode designs.

Note that metals are typically employed as interconnects and contact pads in integrated circuits. Copper is a particularly preferred metal for use in Damascene type processes to form interconnects and contact pads. Other metals that may be suitable for use for this invention include silver and gold.

Example

Figure 6:
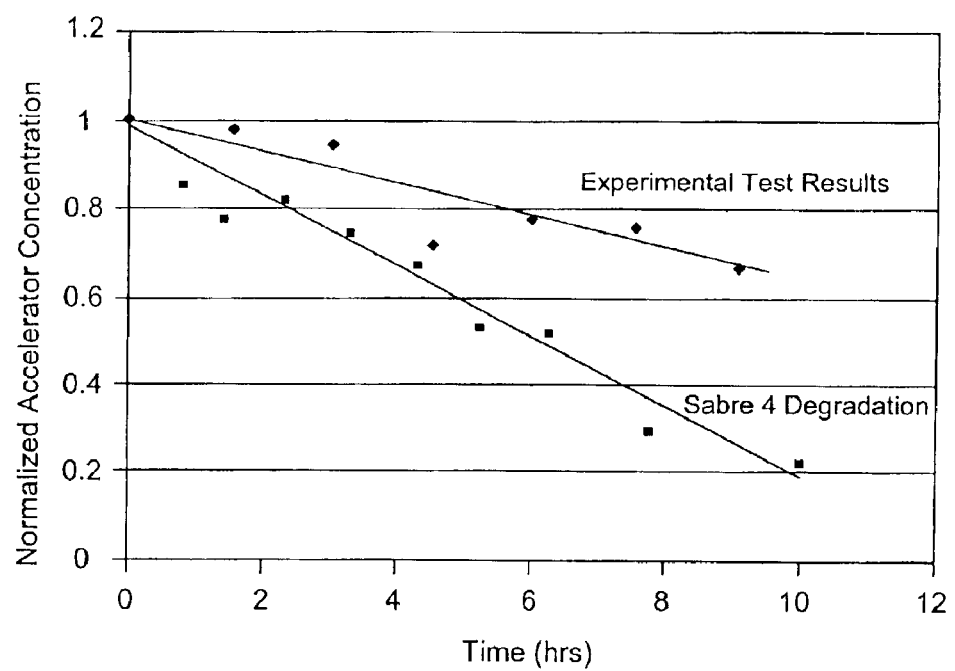
FIG. 6 is a graph presenting data confirming that an apparatus of this invention reduces the amount of additive degradation product in the plating bath.

FIG. 6 shows the comparative rate of additive concentration under similar bath conditions and currents for a Sabre™ tool (electroplating system available from Novellus Corporation of San Jose, Calif.). The lower line presents data obtained from a single bath reservoir for the anode and cathode electrolytes. The upper line presents data obtained from a small test cell (scaled version of the Sabre tool) with a ceramic separator placed between an anode chamber containing plating bath without organic additives and a plating chamber containing additive. Shipley Ultrafill™ was the bath chemistry used in both cases. At the beginning of the process, the concentration of acid and copper were the same in both the anolyte and catholyte chambers. The copper ion concentration was 18 g/l and the concentration of sulfuric acid was 180 g/l. The results show a 2 to 3 fold reduction in the rate of breakdown of accelerator material.

Other Embodiments

While this invention has been described in terms of a few preferred embodiments, it should not be limited to the specifics presented above. Many variations on the above-described preferred embodiments may be employed. Therefore, the invention should be broadly interpreted with reference to the following claims. For example, this invention has been described in the context of electroplating a metal onto a semiconductor substrate. The invention is not limited to semiconductor substrates. Various other substrates can be electroplated using this invention. Examples of other substrates include printed circuit boards, "packaging" for integrated circuits, and the like.

Further, while the invention has been described herein with reference to electroplating metal onto a substrate (e.g., a semiconductor wafer), the same general principles can be applied to electropolishing a metal coated substrate (e.g., a copper coated semiconductor wafer). The only significant difference between these two applications is that electropolishing removes metal and electroplating deposits metal. In electropolishing the substrate acts as the anode and in electroplating the substrate acts as the cathode. In other respects, the same principles are applied, in that additives in the cathode chamber (where metal is being plated) are separated from the anode chamber (where metal is being dissolved). A further description of electropolishing principles, methods and apparatus is provided in U.S. Pat. No. 5,096,550 issued to Mayer et al., incorporated herein by reference for all purposes. Additional discussion of electropolishing is provided in U.S. patent application Ser. No. 09/412,837 previously incorporated by reference.

Typically, electropolishing employs a very viscous concentrated solution of phosphoric acid or other similar electrolyte. Such viscous solutions work well for evenly removing material from the anode work piece. However, they are far less than ideal for depositing material on the cathode of the electropolishing apparatus. Plating onto the cathode from these solutions often provides a powderous deposit. This can produce unwanted particulates in the electrolyte and also reduce the lifetime of the cathode. Still further, dendrites can form in the highly ohmic viscous electrolyte. To mitigate these problems, a cathode chamber can be constructed in accordance with this invention. Within the cathode chamber, a less viscous plating bath can be employed. Typically, it will have a higher water concentration. It may also include additives such as suppressors and brighteners.

What is claimed is:

1. A method of electroplating a metal onto a substrate, in a manner reducing the likelihood of generating electrolyte species that inhibit bottom-up plating on the substrate, the method comprising:
   (a) providing anolyte in an anode chamber having an anode being separated from a cathode chamber by a porous transport barrier that enables migration of ionic species, including ions of the metal, across the transport barrier while substantially blocking non-ionic organic plating additives from diffusing across the transport barrier, wherein the anolyte is substantially free of the plating additives;
   (b) providing catholyte to the cathode chamber containing the substrate; and
   (c) applying a potential difference between the substrate and the anode to allow the substrate to become a cathode and plate the metal onto the substrate without allowing the concentration of plating additives in the anolyte to substantially increase.

2. The method of claim 1, wherein the chemical compositions of the anolyte and the anolyte are different.

3. The method of claim 2, wherein the metal is copper and the anolyte comprises one or more copper salts dissolved in water, and wherein the anolyte is substantially devoid of organic compounds.

4. The method of claim 3, wherein the copper salt is copper sulfate or copper pyrophosphate.

5. The method of claim 2, wherein the catholyte contains a substantially greater concentration of the non-ionic organic plating additives than the anolyte.

6. The method of claim 1, wherein the porous transport barrier comprises a material selected from the group consisting of porous glasses, porous ceramics, silica areogels, organic aerogels, porous polymeric materials, and filter membranes.

7. The method of claim 1, wherein the anode chamber includes a carbon filter layer that is substantially coextensive with the transport barrier, which carbon filter layer can filter non-ionic organic bath additives from a catholyte passing through the transport barrier to the anode chamber.

8. The method of claim 1, wherein the transport barrier comprises a first layer of porous material sandwiched between two additional layers of porous material to provide a three-layer porous membrane, wherein the first layer is substantially thinner than the two additional layers.

9. The method of claim 1, further comprising removing catholyte from the cathode chamber and providing the removed catholyte to a catholyte reservoir.

10. The method of claim 1, further comprising providing catholyte from a catholyte storage reservoir to the cathode chamber.

11. The method of claim 1, further comprising:
   (a) removing catholyte from the cathode chamber,
   (b) treating the catholyte to reduce the concentration of organic additives in the catholyte to produce the anolyte; and
   (c) introducing the treated anolyte produced at (b) to the anode chamber.

12. The method of claim 11, wherein treating the catholyte comprises passing the catholyte through an activated carbon absorbing medium or treating the catholyte by reverse osmosis.

13. The method of claim 1, further comprising providing anolyte to the anode chamber from an anolyte storage reservoir.

14. The method of claim 1, further comprising transferring anolyte to the cathode chamber.

15. The method of claim 1, further comprising a limited flow of anolyte from the anode chamber into the cathode chamber, while preventing catholyte from flowing from the cathode chamber into the anode chamber.

16. The method of claim 1, wherein the metal is copper.

17. The method of claim 16, wherein the anolyte comprises an aqueous solution of between about 10 and 50 gm/l copper and between 0 and about 200 gm/l $H_2SO_4$.

18. A method of electroplating copper onto a substrate, in a manner reducing the likelihood of generating electrolyte species that inhibit bottom-up plating on the substrate, the method comprising:
(a) cycling anolyte through an anolyte flow loop including an anode chamber having an anode;
(b) cycling catholyte through a catholyte flow loop including a cathode chamber having a cathode onto which copper is electroplated, wherein the anode chamber and cathode chamber are separate but ionically connected chambers; and
(c) passing current through the cathode, catholyte, anolyte, and anode to allow electroplating of copper onto the cathode.

19. The method of claim 18, wherein the anode and cathode chambers are separated from one another by a transport barrier that enables migration of ionic species, including copper ions, across the transport barrier while substantially blocking non-ionic organic plating additives from diffusing across the transport barrier, thereby keeping the anolyte substantially free of the plating additives.

20. The method of claim 18, wherein (a), (b), and (c) are performed concurrently.

21. The method of claim 18, wherein the chemical compositions of the anolyte and the catholyte are different.

22. The method of claim 21, wherein the anolyte comprises one or more copper salts and acid dissolved in water, and wherein the anolyte is substantially devoid of organic compounds.

23. The method of claim 21, wherein the catholyte contains a substantially greater concentration of the non-ionic organic plating additives than the anolyte.

24. The method of claim 18, further comprising removing catholyte from the cathode chamber and providing the removed catholyte to a catholyte reservoir.

25. The method of claim 18, further comprising providing catholyte from a catholyte storage reservoir to the cathode chamber.

26. The method of claim 18, further comprising:
(a) removing catholyte from the cathode chamber;
(b) treating the catholyte to reduce the concentration of organic additives in the catholyte to produce the anolyte; and
(c) introducing the treated anolyte produced at (b) to the anode chamber.

27. The method of claim 24, wherein treating the catholyte comprises passing the catholyte through an activated carbon absorbing medium.

28. The method of claim 18, further comprising providing fresh anolyte to the anode chamber from an anolyte source.

29. The method of claim 28, further comprising:
determining how much copper has been electroplated onto a substrate; and
based upon how much copper has been electroplated determining whether to provide to fresh anolyte the anolyte chamber.

30. A method of electroplating copper onto a substrate, in a manner reducing the likelihood of generating electrolyte species that inhibit bottom-up plating on the substrate, the method comprising:
(a) cycling anolyte through an anolyte flow loop including an anode chamber having an anode;
(b) catholyte through a catholyte flow loop including a cathode chamber having a cathode onto which copper is electroplated, wherein the anode chamber and cathode chamber are separate but ionically connected chambers;
(c) passing current through the cathode, catholyte, anolyte, and anode to allow electroplating of copper onto the cathode; and
(d) periodically providing anolyte to the anode chamber from an anolyte source.

31. The method of claim 30, further comprising:
determining how much copper has been electroplated onto a substrate; and
based upon how much copper has been electroplated determining whether to provide to fresh anolyte the anolyte chamber.

* * * * *

UNITED STATES PATENT AND TRADEMARK OFFICE
CERTIFICATE OF CORRECTION

PATENT NO. : 6,890,416 B1  Page 1 of 1
APPLICATION NO. : 10/318497
DATED : May 10, 2005
INVENTOR(S) : Mayer et al.

It is certified that error appears in the above-identified patent and that said Letters Patent is hereby corrected as shown below:

In line 2 of claim 2 (column 22, line 19) change "anolyte and the anolyte" to -- anolyte and the catholyte --.

Signed and Sealed this

Eighth Day of September, 2009

David J. Kappos
*Director of the United States Patent and Trademark Office*